(12) United States Patent
Arayama

(10) Patent No.: US 11,112,695 B2
(45) Date of Patent: Sep. 7, 2021

(54) PHOTOSENSITIVE COMPOSITION, CURED FILM, OPTICAL FILTER, SOLID IMAGE PICKUP ELEMENT, IMAGE DISPLAY DEVICE, AND INFRARED SENSOR

(71) Applicant: FUJIFILM Corporation, Tokyo (JP)

(72) Inventor: Kyohei Arayama, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 99 days.

(21) Appl. No.: 16/438,024

(22) Filed: Jun. 11, 2019

(65) Prior Publication Data

US 2019/0302618 A1 Oct. 3, 2019

Related U.S. Application Data

(63) Continuation of application No. PCT/JP2018/001616, filed on Jan. 19, 2018.

(30) Foreign Application Priority Data

Feb. 9, 2017 (JP) .............................. JP2017-022443
Jan. 12, 2018 (JP) .............................. JP2018-003069

(51) Int. Cl.
*G03F 7/039* (2006.01)
*G03F 7/004* (2006.01)
(Continued)

(52) U.S. Cl.
CPC ............. *G03F 7/0392* (2013.01); *G02B 5/22* (2013.01); *G03F 7/004* (2013.01); *G03F 7/0045* (2013.01); *G03F 7/039* (2013.01); *G02B 5/208* (2013.01)

(58) Field of Classification Search
CPC ........ G03F 7/0392; G03F 7/004; G03F 7/039; G03F 7/0045; G03F 7/038; G03F 7/0007; G02B 5/22; G02B 5/208; G02B 5/223
(Continued)

(56) References Cited

U.S. PATENT DOCUMENTS

2002/0171606 A1* 11/2002 Yabuki ................... G02B 5/223
345/37
2016/0320529 A1 11/2016 Kashiwagi et al.
(Continued)

FOREIGN PATENT DOCUMENTS

JP 2006-150630 A 6/2006
JP 2015-34983 A 2/2015
(Continued)

OTHER PUBLICATIONS

Shimada, JP 2006-150630, Coating Film-Forming Composition, Hardened Film Employing the Same and Lithographic Printing Forme Plate, English Machine Translation. (Year: 2006).*
(Continued)

*Primary Examiner* — Caleen O Sullivan
(74) *Attorney, Agent, or Firm* — Birch, Stewart, Kolasch & Birch, LLP

(57) ABSTRACT

Provided are a photosensitive composition with which a cured film having excellent heat resistance and pattern formability can be formed, a cured film, an optical filter, a solid image pickup element, an image display device, and an infrared sensor. This photosensitive composition includes an infrared shielding agent A, a polymer component B, and a photoacid generator C. The polymer component B in the photosensitive composition includes, for example, a polymer B1 that includes a repeating unit b1 having a group in which at least one group selected from an acid group or a hydroxyl group is protected by an acid-decomposable group and a repeating unit b2 having a crosslinking group.

28 Claims, 1 Drawing Sheet

(51) Int. Cl.
*G02B 5/22* (2006.01)
*G02B 5/20* (2006.01)

(58) Field of Classification Search
USPC ...................................................... 430/270.1
See application file for complete search history.

(56) References Cited

U.S. PATENT DOCUMENTS

| | | |
|---|---|---|
| 2016/0327865 A1 | 11/2016 | Kashiwagi et al. |
| 2017/0363959 A1 | 12/2017 | Takahashi et al. |

FOREIGN PATENT DOCUMENTS

| | | |
|---|---|---|
| JP | 2016-71244 A | 5/2016 |
| JP | 2016-71245 A | 5/2016 |
| WO | WO 2015/033879 A1 | 3/2015 |
| WO | WO 2015/125870 A1 | 8/2015 |
| WO | WO 2015/125871 A1 | 8/2015 |
| WO | WO 2016/104491 A1 | 6/2016 |
| WO | WO 2016/158114 A1 | 10/2016 |

OTHER PUBLICATIONS

Japanese Office Action for Japanese Application No. 2018-567341, dated Feb. 12, 2020, with English translation.
International Preliminary Report on Patentability and the Written Opinion of the International Searching Authority (Forms PCT/IB/326, PCT/IB/373, and PCT/ISA/237) for International Application No. PCT/JP2018/001616, dated Aug. 22, 2019, with English translation.
International Search Report (Form PCT/ISA/210) for International Application No. PCT/JP2018/001616, dated Apr. 10, 2018, with English translation.
Taiwanese Office Action and Search Report for corresponding Taiwanese Application No. 107103606, dated Apr. 30, 2021, with partial English translation.

\* cited by examiner

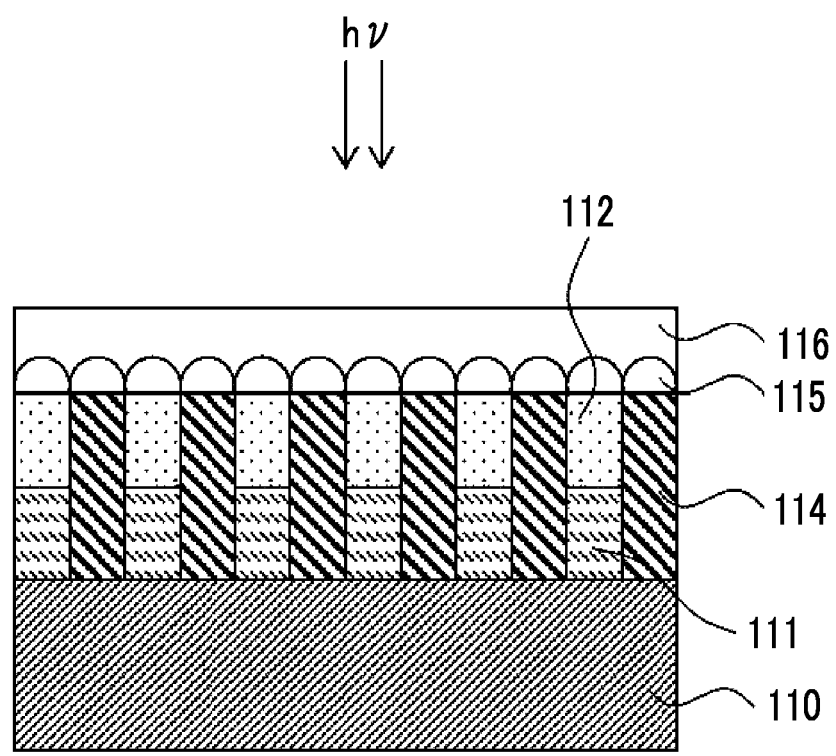

PHOTOSENSITIVE COMPOSITION, CURED FILM, OPTICAL FILTER, SOLID IMAGE PICKUP ELEMENT, IMAGE DISPLAY DEVICE, AND INFRARED SENSOR

CROSS-REFERENCE TO RELATED APPLICATIONS

This application is a Continuation of PCT International Application No. PCT/JP2018/001616 filed on Jan. 19, 2018, which claims priority under 35 U.S.C § 119(a) to Japanese Patent Application No. 2017-022443 filed on Feb. 9, 2017 and Japanese Patent Application No. 2018-003069 filed on Jan. 12, 2018. Each of the above application(s) is hereby expressly incorporated by reference, in its entirety, into the present application.

BACKGROUND OF THE INVENTION

1. Field of the Invention

The present invention relates to a photosensitive composition, a cured film, an optical filter, a solid image pickup element, an image display device, and an infrared sensor.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, visibility may be corrected using a near infrared cut filter. A near infrared cut filter is manufactured, for example, using a composition including an infrared shielding agent.

For example, WO2016/104491A describes that a near infrared cut filter or the like is manufactured using an infrared shielding composition including: an infrared shielding agent having an absorption maximum in a wavelength range of 700 to 2000 nm; and a siloxane polymer.

On the other hand, WO2015/033879A describes an invention relating to a photosensitive composition including: a polymer component including a polymer that satisfies at least one of (1) or (2); a photoacid generator; and a solvent.

(1) a polymer that includes a constitutional unit (a1) having a group in which an acid group is protected by an acetal group and a constitutional unit (a2) having a crosslinking group (2) a polymer that includes the polymer including the constitutional unit (a1) and a constitutional unit (a2)

SUMMARY OF THE INVENTION

However, the infrared shielding agent is likely to have low heat resistance in many cases, and spectral characteristics thereof tend to change by heating. For example, transmittance with respect to light in a visible range may deteriorate, or shielding properties with respect to light in a near infrared range may deteriorate. Therefore, for a film that is formed using a composition including an infrared shielding agent, further improvement of heat resistance is desired. In addition, it cannot be said that the heat resistance of the invention described in WO2016/104491A is sufficient.

WO2015/033879A describes the invention relating to a semiconductor resist and neither describes nor implies the use of an infrared shielding agent.

Accordingly, an object of the present invention is to provide a photosensitive composition with which a cured film having excellent heat resistance and pattern formability can be formed, a cured film, an optical filter, a solid image pickup element, an image display device, and an infrared sensor.

As a result of thorough investigation under the above-described circumstances, the present inventors found that the object of the present invention can be achieved with a photosensitive composition having a configuration described below, thereby completing the present invention. Accordingly, the present invention provides the following.

<1> A photosensitive composition comprising an infrared shielding agent A, a polymer component B, and a photoacid generator C, in which at least one of the following requirement (1), (2), (3) or (4) is satisfied, (1): the polymer component B includes a polymer B1 that includes a repeating unit b1 having a group in which at least one group selected from an acid group or a hydroxyl group is protected by an acid-decomposable group and a repeating unit b2 having a crosslinking group, (2): the polymer component B includes a polymer B2 including the repeating unit b1 and a polymer B3 including the repeating unit b2, (3): the polymer component B includes the polymer B2 and the photosensitive composition further comprises a compound having a molecular weight of 1000 or lower that has a crosslinking group, and (4) the polymer component B includes the polymer B3 and the photosensitive composition further comprises a compound having a molecular weight of 1000 or lower that has a group in which at least one group selected from an acid group or a hydroxyl group is protected by an acid-decomposable group.

<2> The photosensitive composition according to <1>, in which the acid-decomposable group is any one of groups represented by following Formulae (Y1) to (Y4), $$-C(R^{31})(R^{32})(R^{33}),\qquad \text{Formula (Y1):}$$

$$-C(=O)OC(R^{31})(R^{32})(R^{33}),\qquad \text{Formula (Y2):}$$

$$-C(R^{36})(R^{37})(OR^{38}),\qquad \text{Formula (Y3):}$$

$$-C(Rn)(H)(Ar),\qquad \text{Formula (Y4):}$$

in Formulae (Y1) and (Y2), $R^{31}$ to $R^{33}$ each independently represent an alkyl group and two of $R^{31}$ to $R^{33}$ may be bonded to each other to form a ring, in Formula (Y3), $R^{36}$ and $R^{37}$ each independently represent a hydrogen atom, an alkyl group, or an aryl group, at least one of $R^{36}$ or $R^{37}$ represents an alkyl group or an aryl group, $R^{38}$ represents an alkyl group or an aryl group, and $R^{36}$ or $R^{37}$ may be bonded to $R^{38}$ to form a ring, and in Formula (Y4), Ar represents an aromatic ring group, Rn represents an alkyl group or an aryl group, and Rn and Ar may be bonded to each other to form a ring.

<3> The photosensitive composition according to <1> or <2>, in which the crosslinking group is at least one selected from an epoxy group, an oxetanyl group, a methylol group, or an alkoxymethylol group.

<4> The photosensitive composition according to any one of <1> to <3>, further comprising the polymer B1.

<5> The photosensitive composition according to any one of <1> to <4>,
in which the infrared shielding agent A is at least one selected from a diiminium compound, a squarylium compound, a cyanine compound, a phthalocyanine compound, a naphthalocyanine compound, a quaterrylene compound, an aminium compound, an iminium compound, an azo compound, an anthraquinone compound, a porphyrin compound, a pyrrolopyrrole compound, an oxonol compound, a croconium compound, a hexaphyrin compound, a metal dithiol compound, a copper compound, a tungsten compound, or a metal boride.

<6> The photosensitive composition according to any one of <1> to <5>,
in which the photoacid generator C is an oxime sulfonate compound.

<7> The photosensitive composition according to any one of <1> to <6>, further comprising:
a coloring material that allows transmission of infrared light and shields visible light.

<8> The photosensitive composition according to any one of <1> to <7>, which is a positive photosensitive composition.

<9> A cured film which is formed using the photosensitive composition according to any one of <1> to <8>.

<10> An optical filter comprising:
the cured film according to <9>.

<11> The optical filter according to <10>,
in which the optical filter is a near infrared cut filter or an infrared transmitting filter.

<12> A solid image pickup element comprising:
the cured film according to <9>.

<13> An image display device comprising:
the cured film according to <9>.

<14> An infrared sensor comprising:
the cured film according to <9>.

According to the present invention, it is possible to provide a photosensitive composition with which a cured film having excellent heat resistance and pattern formability can be formed, a cured film, an optical filter, a solid image pickup element, an image display device, and an infrared sensor.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, a weight-average molecular weight and a number-average molecular weight are defined as values in terms of polystyrene obtained by gel permeation chromatography (GPC).

In this specification, the weight-average molecular weight (Mw) and the number-average molecular weight (Mn) can be obtained, for example, by using HLC-8220GPC (manufactured by Tosoh Corporation), using a column in which TOSOH TSK gel Super HZM-H, TOSOH TSK gel Super HZ4000, and TOSOH TSK gel Super HZ2000 are linked to each other, and using tetrahydrofuran as a developing solvent.

In this specification, in a chemical formula, Me represents a methyl group, Et represents an ethyl group, Bu represents a butyl group, and Ph represents a phenyl group.

In this specification, near infrared light denotes light (electromagnetic wave) having an absorption maximum in a wavelength range of 700 to 2500 nm.

In this specification, a total solid content denotes the total mass of all the components of the composition excluding a solvent.

In this specification, the term "step" denotes not only an individual step but also a step which is not clearly distinguishable from another step as long as an effect expected from the step can be achieved.

<Photosensitive Composition>

A photosensitive composition according to an embodiment of the present invention comprises an infrared shielding agent A, a polymer component B, and a photoacid generator C, in which at least one of the following requirement (1), (2), (3), or (4) is satisfied.

(1): the polymer component B includes a polymer B1 that includes a repeating unit b1 having a group in which at least one group selected from an acid group or a hydroxyl group is protected by an acid-decomposable group and a repeating unit b2 having a crosslinking group (2): the polymer component B includes a polymer B2 including the repeating unit b1 and a polymer B3 including the repeating unit b2

(3): the polymer component B includes the polymer B2 and the photosensitive composition further comprises a compound having a molecular weight of 1000 or lower that has a crosslinking group (4) the polymer component B includes the polymer B3 and the photosensitive composition further comprises a compound having a molecular weight of 1000 or lower that has a group in which at least one group selected from an acid group or a hydroxyl group is protected by an acid-decomposable group By using the photosensitive composition according to the embodiment of the present invention, a cured film having excellent heat resistance and pattern formability can be formed. The photosensitive composition according to the embodiment of the present invention comprises the photoacid generator. Therefore, the acid-decomposable group is decomposed to produce an acid group or a hydroxyl group by an acid produced from the photoacid generator in an exposed portion. As a result, in the exposed portion, solubility in a developer is enhanced, and thus the exposed portion is developed and removed such that a positive image is formed. In addition, the developed positive image includes a component that includes the group (also referred to as "protective acid group" or the like") in which at least one group selected from an acid group or a hydroxyl group is protected by an acid-decomposable group. However, by further heating the developed positive image, this protective acid group or the like is decomposed to produce an acid group or a hydroxyl group such that the acid group or the hydroxyl group may be crosslinked with a crosslinking group in a polymer or a crosslinking agent or can promote a reaction between crosslinking groups. Therefore, it is presumed that the crosslinking density in the film can be improved. Thus, with the photosensitive composition according to the embodiment of the present invention, a cured film having excellent heat resistance and pattern formability can be formed. The photosensitive composition according to the embodiment of the present invention can be used as a positive photosensitive composition. For example, the photosensitive composition according to the embodiment of the present invention can be preferably used as a chemically amplified positive photosensitive composition. Hereinafter, the present invention will be described in detail.

<<Infrared Shielding Agent>>

The photosensitive composition according to the embodiment of the present invention comprises an infrared shielding agent. The infrared shielding agent may be a material that absorbs infrared light or a material that reflects infrared light. As the material that absorbs infrared light, a compound having an absorption in a wavelength range of 700 to 2000 nm is preferable, and a compound having an absorption maximum in a wavelength range of 700 to 2000 nm is more preferable.

In the present invention, as the infrared shielding agent, a diiminium compound, a squarylium compound, a cyanine compound, a phthalocyanine compound, a naphthalocyanine compound, a quaterrylene compound, an aminium compound, an iminium compound, an azo compound, an anthraquinone compound, a porphyrin compound, a pyrrolopyrrole compound, an oxonol compound, a croconium compound, a hexaphyrin compound, a metal dithiol compound, a copper compound, a tungsten compound, or a metal boride is preferable, a diiminium compound, a squarylium compound, a cyanine compound, a phthalocyanine compound, a naphthalocyanine compound, a quaterrylene compound, a pyrrolopyrrole compound, a metal dithiol compound, a copper compound, or a tungsten compound is more preferable, a squarylium compound, a cyanine compound, a phthalocyanine compound, or a pyrrolopyrrole compound is still more preferable, and a squarylium compound or a pyrrolopyrrole compound is still more preferable.

As the pyrrolopyrrole compound, a compound represented by Formula (PP) is preferable.

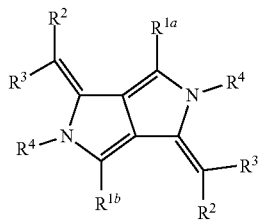

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$ or a metal atom, $R^4$ may form a covalent bond or a coordinate bond with at least one selected from $R^{1a}$, $R^{1b}$, or $R^3$, and $R^{4A}$ and $R^{4B}$ each independently represent a substituent. The details of Formula (PP) can be found in paragraphs "0017" to "0047" of JP2009-263614A, paragraphs "0011" to "0036" of JP2011-068731A, and paragraphs "0010" to "0024" of WO2015/166873A, the contents of which are incorporated herein by reference.

$R^{1a}$ and $R^{1b}$ each independently represent preferably an aryl group or a heteroaryl group, and more preferably an aryl group. In addition, the alkyl group, the aryl group, and the heteroaryl group represented by $R^{1a}$ to $R^{1b}$ may have a substituent or may be unsubstituted. Examples of the substituent include an alkoxy group, a hydroxy group, a halogen atom, a cyano group, a nitro group, —$OCOR^{11}$, —$SOR^{12}$, and —$SO_2R^{13}$. $R^{11}$ to $R^{13}$ each independently represent a hydrocarbon group or a heteroaryl group. In addition, examples of the substituent include substituents described in paragraphs "0020" to "0022" of 2009-263614A. Among these, as the substituent, an alkoxy group, a hydroxy group, a cyano group, a nitro group, —$OCOR^{11}$, —$SOR^{12}$, or —$SO_2R^{13}$ is preferable. As the group represented by $R^{1a}$ and $R^{1b}$, an aryl group which has an alkoxy group having a branched alkyl group as a substituent, an aryl group which has a hydroxy group as a substituent, or an aryl group which has a group represented by —$OCOR^{11}$ as a substituent is preferable. The number of carbon atoms in the branched alkyl group is preferably 3 to 30 and more preferably 3 to 20.

It is preferable that at least one of $R^2$ or $R^3$ represents an electron-withdrawing group, and it is more preferable that $R^2$ represents an electron-withdrawing group (preferably a cyano group) and $R^3$ represents a heteroaryl group. It is preferable that the heteroaryl group is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms. Two $R^2$'s in Formula (PP) may be the same as or different from each other. In addition, two $R^3$'s in Formula (PP) may be the same as or different from each other.

$R^4$ represents preferably a hydrogen atom, an alkyl group, an aryl group, a heteroaryl group, or a group represented by —$BR^{4A}R^{4B}$, more preferably a hydrogen atom, an alkyl group an aryl group, or a group represented by —$BR^{4A}R^{4B}$, and still more preferably a group represented by —$BR^{4A}R^{4B}$. As the substituent represented by $R^{4A}$ and $R^{4B}$, a halogen atom, an alkyl group, an alkoxy group, an aryl group, or a heteroaryl group is preferable, an alkyl group, an aryl group, or a heteroaryl group is more preferable, and an aryl group is still more preferable. Each of the groups may further have a substituent. Two $R^4$'s in Formula (PP) may be the same as or different from each other.

Specific examples of the compound represented by Formula (PP) include the following compounds and a compound described below in Examples. In the following structural formulae, Me represents a methyl group, and Ph represents a phenyl group. In addition, examples of the pyrrolopyrrole compound include compounds described in paragraphs "0016" to "0058" of JP2009-263614A, paragraphs "0037" to "0052" of JP2011-068731A, paragraphs "0014" to "0027" of JP2014-130343A, paragraphs "0010" to "0033" of WO2015/166873A, the contents of which are incorporated herein by reference.

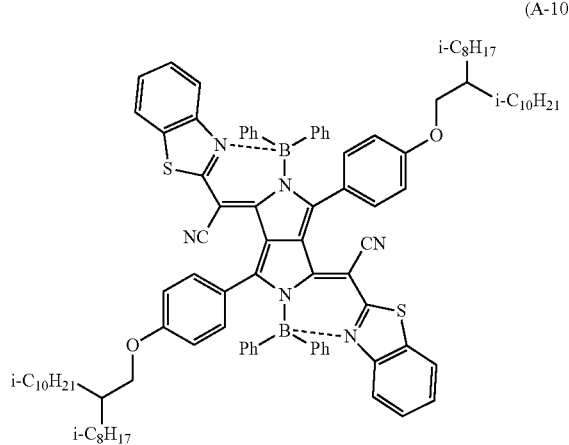

(A-10)

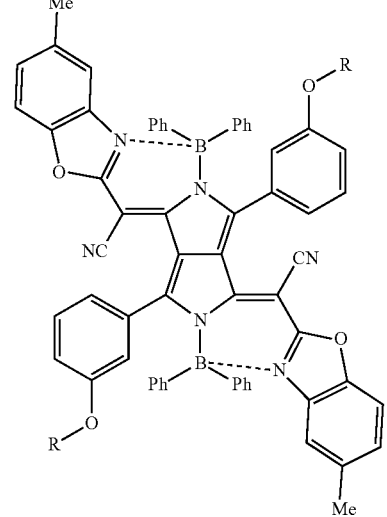

(A-11)

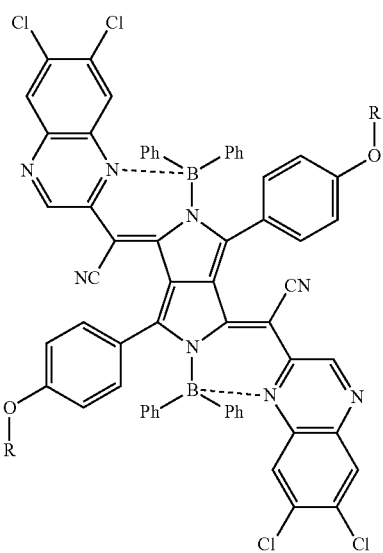

(A-12)

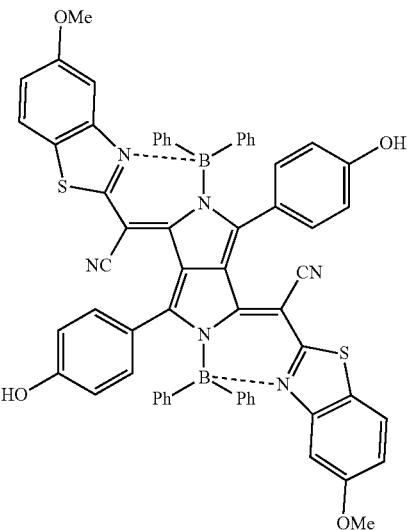

(A-16)

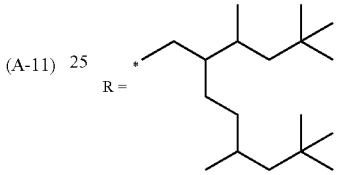

As the squarylium compound, a compound represented by the following Formula (SQ) is preferable.

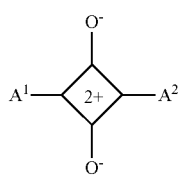

(SQ)

In Formula (SQ), $A^1$ and $A^2$ each independently represent an aryl group, a heteroaryl group, or a group represented by the following Formula (A-1).

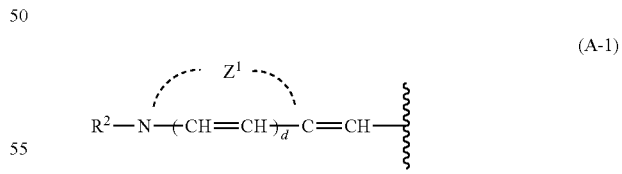

(A-1)

In Formula (A-1), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond. The details of Formula (SQ) can be found in paragraphs "0020" to "0049" of JP2011-208101A, the content of which is incorporated herein by reference.

As shown below, cations in Formula (SQ) are present without being localized.

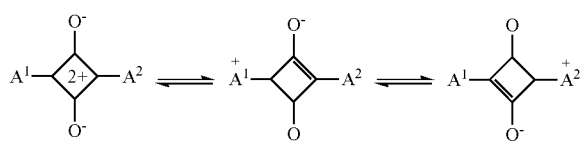

Specific examples of the squarylium compound include compounds described in Examples. In addition, other examples of the squarylium compound include compounds described in JP3094037B, JP1985-228448A (JP-S60-228448A), JP1989-146846A (JP-H1-146846A), JP1989-228960A (JP-H1-228960A), paragraph "0178" of JP2012-215806A, and paragraphs "0044" to "0049" of JP2011-208101A, the contents of which are incorporated herein by reference.

As the cyanine compound, a compound represented by Formula (C) is preferable.

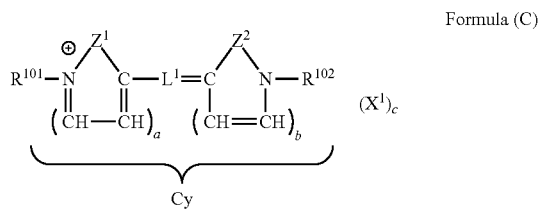

Formula (C)

In the formula, $Z^1$ and $Z^2$ each independently represent a non-metal atomic group for forming a 5- or 6-membered nitrogen-containing heterocycle which may be fused.

$R^{101}$ and $R^{102}$ each independently represent an alkyl group, an alkenyl group, an alkynyl group, an aralkyl group, or an aryl group.

$L^1$ represents a methine chain including an odd number of methine groups.

a and b each independently represent 0 or 1.

In a case where a represents 0, a carbon atom and a nitrogen atom are bonded through a double bond. In a case where b represents 0, a carbon atom and a nitrogen atom are bonded through a single bond.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

Examples of the cyanine compound include compounds described in paragraphs "0026" to "0030" of JP2002-194040A, paragraphs "0041" and "0042" of JP2007-271745A, paragraphs "0016" and "0018" of JP2007-334325A, JP2008-088426A, paragraphs "0044" and "0045" of JP2009-108267A, JP2009-185161A, JP2009-191213A, paragraph "0160" of JP2012-215806A, paragraphs "0047" to "0049" of JP2013-155353A, JP2015-172004A, and JP2015-172102A, the contents of which are incorporated herein by reference. Examples of a commercially available product of the cyanine compound include Diato chmix 1371F (manufactured by Daito Chemix Co., Ltd.) And NK series such as NK-3212 or NK-5060 (manufactured by Hayashibara Co., Ltd.).

As the copper compound, a copper complex is preferable. It is preferable that the copper complex is a complex of copper and a compound (ligand) having a coordination site coordinated to copper. Examples of the coordination site coordinated to copper include a coordination site coordinated by an anion and a coordinating atom coordinated by an unshared electron pair. The copper complex may include two or more ligands. In a case where the copper complex includes two or more ligands, the ligands may be the same as or different from each other. The copper complex may be tetradentate-coordinated, pentadentate-coordinated, or hexadentate-coordinated, more preferably tetradentate-coordinated or pentadentate-coordinated, and still more preferably pentadentate-coordinated. In addition, in the copper complex, it is preferable that copper and the ligand form a 5-membered ring and/or a 6-membered ring. This copper complex is stable in shape and has excellent complex stability.

As the copper compound, for example, a copper complex represented by the following Formula (Cu-1) can be used. This copper complex is a copper compound in which a ligand L is coordinated to copper as central metal, and the copper is typically divalent copper. For example, the copper complex can be obtained, for example, by mixing and/or reaction of a compound which forms the ligand L or a salt thereof with a copper component.

$$Cu(L)_{n1} \cdot (X)_{n2}$$ Formula (Cu-1)

In the formula, L represents a ligand coordinated to copper, and X represents a counter ion. n1 represents an integer of 1 to 4. n2 represents an integer of 0 to 4.

X represents a counter ion. The copper compound site may be a neutral complex having no charge, a cationic complex, or an anionic complex. In this case, optionally, a counter ion is present to neutralize the charge of the copper compound.

L represents a ligand coordinated to copper. Examples of the ligand coordinated to copper include a compound having a coordination site coordinated to copper. For example, a compound having one or more selected from a coordination site coordinated to copper by an anion or a coordinating atom coordinated to copper by an unshared electron pair can be used. The coordination site coordinated by an anion may or may not be dissociable. As the ligand L, a compound (multidentate ligand) having two or more coordination sites coordinated to copper is preferable. In addition, in order to improve visible transparency, it is preferable that a plurality of π-conjugated systems such as aromatic compounds are not continuously bonded to each other in the ligand L. As the ligand L, a compound (monodentate ligand) having one coordination site coordinated to copper and a compound (multidentate ligand) having two or more coordination sites coordinated to copper can also be used in combination. Examples of the monodentate ligand include a compound having one coordination site coordinated to copper by an anion or one coordinating atom coordinated to copper by an unshared electron pair.

As the anion in the ligand L, an oxygen anion, a nitrogen anion, or a sulfur anion is preferable. As the coordinating atom coordinated by an unshared electron pair in the ligand L, an oxygen atom, a nitrogen atom, a sulfur atom, or a phosphorus atom is preferable, an oxygen atom, a nitrogen atom, or a sulfur atom is more preferable, an oxygen atom or a nitrogen atom is still more preferable, and a nitrogen atom is still more preferable. In a case where the coordinating atom coordinated by an unshared electron pair is a nitrogen atom, that an atom adjacent to the nitrogen atom is preferably a carbon atom or a nitrogen atom and more preferably a carbon atom. In addition, the coordinating atom coordinated by an unshared electron pair may be included in a ring. In a case where the coordinating atom coordinated by an unshared electron pair is included in a ring, the ring including the coordinating atom coordinated by an unshared electron pair may be monocyclic or polycyclic and may be aromatic or nonaromatic. The ring including the coordinating atom coordinated by an unshared electron pair is preferably a 5- to 12-membered ring and more preferably a 5- to 7-membered ring. In addition, as the ligand L, for example, a phosphate compound or a sulfonic acid compound can also be used. The details of the ligand can be found in, for example, paragraphs "0022" to "0042" of JP2014-041318A, paragraphs "0021" to "0039" of JP2015-043063A, and paragraphs "0013" to "0070" of JP2016-006476A, the contents of which are incorporated herein by reference. In addition, specific examples of the copper compound include compounds described in JP2013-253224A, JP2014-032380A, JP2014-026070A, JP2014-026178A, JP2014-139616A, JP2014-139617A, JP2014-041318A, JP2015-043063A, and JP2016-006476A, the contents of which are incorporated herein by reference.

Examples of the diiminium compound include compounds described in JP1989-113482A (JP-H1-113482A), JP1998-180922A (JP-H10-180922A), WO2003/005076A, WO2004/048480A, WO2005/044782A, WO2006/120888A, JP2007-246464A, WO2007/148595A, JP2011-038007A, and paragraph "0118" of WO2011/118171A, the contents of which are incorporated herein by reference. Examples of a commercially available product of the diiminium compound include: EPOLIGHT series such as EPOLIGHT 1178 (manufactured by Epolin Inc.); CIR-108X series such as CIR-1085 and CIR-96X series (manufactured by Japan Carlit Co., Ltd.); and IRG 022, IRG 023, and PDC-220 (manufactured by Nippon Kayaku Co., Ltd.). Examples of the phthalocyanine compound include compounds described in JP1985-224589A (JP-S60-224589A), JP2005-537319A, JP1992-023868A (JP-H4-023868A), JP1992-039361A (JP-H4-039361A), JP1993-078364A (JP-H5-078364A), JP1993-222047A (JP-H5-222047A), JP1993-222301A (JP-H5-222301A), JP1993-222302A (JP-H5-222302A), JP1993-345861A (JP-H5-345861A), JP1994-025548A (JP-H5-025548A), JP1994-107663A (JP-H6-107663A), JP1994-192584A (JP-H6-192584A), JP1994-228533A (JP-H6-228533A), JP1995-118551A (JP-H7-118551A), JP1995-118552A (JP-H7-118552A), JP1996-120186A (JP-H8-120186A), JP1996-225751A (JP-H8-225751A), JP1997-202860A (JP-H9-202860A), JP1998-120927A (JP-H10-120927A), JP1998-182995A (JP-H10-182995A), JP1999-035838A (JP-H11-035838A), JP2000-026748A, JP2000-063691A, JP2001-106689A, JP2004-018561A, JP2005-220060A, JP2007-169343A, and paragraphs "0026" and "0027" of JP2013-195480A, the contents of which are incorporated herein by reference. Examples of a commercially available product of the phthalocyanine compound include: FB series such as FB-22 or FB-24 (manufactured by Yamada Chemical Co., Ltd.); Excolor series such as Excolor TX-EX720 or Excolor 708K (manufactured by Nippon Shokubai Co., Ltd.); Lumogen IR788 (manufactured by BASF SE); ABS643, ABS654, ABS667, ABS670T, IRA693N, and IRA735 (manufactured by Exciton Inc.); SDA3598, SDA6075, SDA8030, SDA8303, SDA8470, SDA3039, SDA3040, SDA3922, and SDA7257 (manufactured by H. W. Sands Corporation); and TAP-15 and IR-706 (manufactured by Yamada Chemical Co., Ltd.). Examples of the naphthalocyanine compound include compounds described in JP1999-152413A (JP-H11-152413A), JP1999-152414A (JP-H11-152414A), JP1999-152415A (JP-H11-152415A), and paragraphs "0046" to "0049" of JP2009-215542A, the contents of which are incorporated herein by reference. Examples of the quaterrylene compound include a compound described in paragraph "0021" of JP2008-009206A, the content of which is incorporated herein by reference. Examples of a commercially available product of the quaterrylene compound include Lumogen IR765 (manufactured by BASF SE). Examples of the aminium compound include compounds described in paragraph "0018" of JP1996-027371A (JP-H8-027371A) and JP2007-039343A, the contents of which are incorporated herein by reference. Examples of a commercially available product of the aminium compound include IRG002 and IRG003 (manufactured by Nippon Kayaku Co., Ltd.). Examples of the iminium compound include compounds described in paragraph "0116" of WO2011/118171A, the content of which is incorporated herein by reference. Examples of the azo compound include a compound described in paragraphs "0114" to "0117" of JP2012-215806A, the content of which is incorporated herein by reference. Examples of the anthraquinone compound include a compound described in paragraphs "0128" and "0129" of JP2012-215806A, the content of which is incorporated herein by reference. Examples of the porphyrin compound include a compound represented by Formula (1) described in JP3834479B, the content of which is incorporated herein by reference. Examples of the oxonol compound include a compound described in paragraph "0046" of JP2007-271745A, the content of which is incorporated herein by reference. Examples of the croconium compound include compounds described in paragraph "0049" of JP2007-271745A, JP2007-031644A, and JP2007-169315A, the contents of which are incorporated herein by reference. In addition, specific examples of the croconium compound include a compound described below in Examples. Examples of the hexaphyrin compound include a compound represented by Formula (1) described in WO2002/016144A, the content of which is incorporated herein by reference. Examples of the metal dithiol compound include compounds described in JP1989-114801A (JP-H1-114801A), JP1989-074272A (JP-S64-074272A), JP1987-039682A (JP-S62-039682A), JP1986-080106A (JP-S61-080106A), JP1986-042585A (JP-S61-042585A), and JP1986-032003A (JP-S61-032003A), the contents of which are incorporated herein by reference. As the tungsten compound, a tungsten oxide compound is preferable, cesium tungsten oxide or rubidium tungsten oxide is more preferable, and cesium tungsten oxide is still more preferable. Examples of a compositional formula of cesium tungsten oxide include $Cs_{0.33}WO_3$. In addition, examples of a compositional formula of rubidium tungsten oxide include $Rb_{0.33}WO_3$. The tungsten oxide compound is also available in the form of, for example, a dispersion of tungsten particles such as YMF-02A (manufactured by Sumitomo Metal Mining Co., Ltd.). Examples of the metal boride include a compound described in paragraph "0049" of JP2012-068418A, the content of which is incorporated herein by reference. In particular, lanthanum boride is preferable.

In addition, the details of the infrared shielding agent can be found in paragraphs "0057" to "0093" of JP2016-206503A, the content of which is incorporated herein by reference.

In the photosensitive composition according to the embodiment of the present invention, the content of the infrared shielding agent is preferably 0.1 to 80 mass % with respect to the total solid content of the photosensitive composition. The upper limit is preferably 60 mass % or lower and more preferably 40 mass % or lower. The lower limit is preferably 1 mass % or higher and more preferably 3 mass % or higher. In the photosensitive composition according to the embodiment of the present invention, as the infrared shielding agent, one kind may be used alone, or two or more kinds may be used in combination. In a case where two or more infrared shielding agents are used in combination, it is preferable that the total content of the infrared shielding agents is in the above-described range.

<Polymer Component B>

The polymer component B in the photosensitive composition according to the embodiment of the present invention includes at least one polymer selected from the polymer B1 that includes a repeating unit b1 having a group in which at least one group selected from an acid group or a hydroxyl group is protected by an acid-decomposable group and a repeating unit b2 having a crosslinking group, the polymer B2 including the repeating unit b1, or the polymer B3 including the repeating unit b2. Hereinafter, the repeating unit b1 having a group in which at least one group selected from an acid group or a hydroxyl group is protected by an acid-decomposable group will also be referred to as "repeating unit b1". In addition, the repeating unit b2 having a crosslinking group will also be referred to as "repeating unit b2".

Here, in the photosensitive composition according to the embodiment of the present invention, at least one of the following requirement (1), (2), (3) or (4) is satisfied, it is preferable that at least one of the requirement (1), (2) or (3) is satisfied, it is more preferable that the requirement (1) or (2) is satisfied, and it is still more preferable that the requirement (1) is satisfied.

(1): the polymer component B includes the polymer B1

(2): the polymer component B includes the polymer B2 and the polymer B3

(3): the polymer component B includes the polymer B2 and the photosensitive composition further comprises a compound (a crosslinking agent described below) having a molecular weight of 1000 or lower that has a crosslinking group (4) the polymer component B includes the polymer B3 and the photosensitive composition further comprises a compound (a compound E described below) having a molecular weight of 1000 or lower that has a group in which at least one group selected from an acid group or a hydroxyl group is protected by an acid-decomposable group The content of the repeating unit b1 in the polymer B1 is preferably 3 to 70 mol %, more preferably 10 to 60 mol %, and still more preferably 20 to 50 mol % with respect to all the repeating units. The content of the repeating unit b2 in the polymer B1 is preferably 3 to 70 mol %, more preferably 10 to 60 mol %, and still more preferably 20 to 50 mol % with respect to all the repeating units.

The content of the repeating unit b1 in the polymer B2 is preferably 5 to 100 mol %, more preferably 5 to 90 mol %, and still more preferably 10 to 85 mol % with respect to all the repeating units.

The content of the repeating unit b2 in the polymer B3 is preferably 5 to 100 mol %, more preferably 5 to 90 mol %, and still more preferably 10 to 85 mol % with respect to all the repeating units.

In the aspect (2), a mass ratio between the polymer B2 and the polymer B3 is preferably 95:5 to 5:95, more preferably 80:20 to 20:80, and still more preferably 70:30 to 30:70.

In addition, in the aspect (2), the content of the repeating unit b1 is preferably 3 to 70 mol %, more preferably 10 to 60 mol %, and still more preferably 20 to 50 mol % with respect to all the repeating units of the polymer component B. In addition, the content of the repeating unit b2 is preferably 3 to 70 mol %, more preferably 10 to 60 mol %, and still more preferably 20 to 50 mol % with respect to all the repeating units.

The weight-average molecular weight of the polymers B1 to B3 is preferably 1000 to 200000, more preferably 3000 to 20000, and still more preferably 5000 to 15000. In a case where the weight-average molecular weight of the polymers B1 to B3 is in the above-described range, deterioration in heat resistance and dry etching resistance can be prevented. In addition, deterioration in developability and deterioration in film forming properties caused by an increase in viscosity can be prevented. The dispersity (molecular weight distribution) of the polymers B1 to B3 is preferably 1 to 5, more preferably 1 to 3, still more preferably 1.2 to 3.0, and still more preferably 1.2 to 2.0. As the dispersity of the polymer decreases, resolution and pattern formability are excellent.

Each of the polymers B1 to B3 is preferably an addition polymerization type polymer, more preferably a polymer including a repeating unit selected from a repeating unit derived from (meth)acrylic acid and/or an ester thereof, a repeating unit derived from styrene, or a repeating unit derived from a vinyl compound, and still more preferably a polymer including a repeating unit derived from (meth) acrylic acid and/or an ester thereof. Hereinafter, the respective repeating units will be described.

(Repeating Unit b1)

The repeating unit b1 is a repeating unit having a group in which at least one group selected from an acid group or a hydroxyl group is protected by an acid-decomposable group. By the polymer component B including the polymer including the repeating unit b1, a high-sensitivity photosensitive composition can be obtained.

In the present invention, "the group in which at least one group selected from an acid group or a hydroxyl group is protected by an acid-decomposable group (hereinafter, also referred to as "protective acid group")" refers to a group that causes a deprotection reaction with an acid as a catalyst (or an initiator) to produce an acid group or a hydroxyl group. By the polymer including the protective acid group, the solubility in an alkali developer is enhanced due to the action of an acid. Examples of the acid group and the hydroxyl group in the protective acid group include a carboxyl group, an alcoholic hydroxyl group, a phenolic hydroxyl group, and a sulfonate group. A carboxyl group, an alcoholic hydroxyl group, or a phenolic hydroxyl group is preferable, and a carboxyl group or a phenolic hydroxyl group is more preferable.

Examples of the acid-decomposable group include groups represented by Formulae (Y1) to (Y4). Among these, from the viewpoint that a finer pattern can be formed, a group represented by Formula (Y1), a group represented by Formula (Y3), or a group represented by Formula (Y4) is preferable, a group represented by Formula (Y3) or a group represented by Formula (Y4) is more preferable, and a group represented by Formula (Y3) is still more preferable.

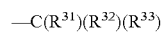  Formula (Y1):

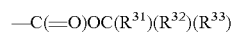  Formula (Y2):

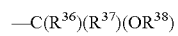  Formula (Y3):

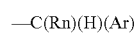  Formula (Y4):

In Formulae (Y1) and (Y2) $R^{31}$ to $R^{33}$ each independently represent an alkyl group. The alkyl group may be linear, branched, or cyclic. The number of carbon atoms in the alkyl group is preferably 1 to 12, more preferably 1 to 6, and still more preferably 1 to 4. In a case where all of $R^{31}$ to $R^{33}$ represent an alkyl group (linear or branched), it is preferable that at least two of $R^{31}$ to $R^{33}$ represent a methyl group. $R^{31}$ to $R^{33}$ each independently represent preferably a linear or branched alkyl group and more preferably a linear alkyl group. In Formula (Y1) and (Y2), two of $R^{31}$ to $R^{33}$ may be bonded to each other to form a ring. As the alkyl group represented by $R^{31}$ to $R^{33}$, a methyl group, an ethyl group, an n-propyl group, an isopropyl group, an n-butyl group, an isobutyl group, a t-butyl group, a cyclopentyl group, a cyclohexyl group, a norbornyl group, a tetracyclodecanyl group, a tetracyclododecanyl group, or an adamantyl group is preferable.

As the ring that is formed by two of $R^{31}$ to $R^{33}$ which bonded to each other, a monocycloalkyl group such as a cyclopentyl group or a cyclohexyl group, or a polycycloalkyl group such as a norbornyl group, a tetracyclodecanyl group, a tetracyclododecanyl group, or an adamantyl group is preferable, and a monocycloalkyl group having 5 or 6 carbon atoms is more preferable. In the cycloalkyl group, for example, one methylene group constituting the ring may be substituted with a heteroatom such as an oxygen atom or a group having a heteroatom such as a carbonyl group.

In the group represented by Formula (Y1) or (Y2), for example, an aspect in which $R^{31}$ represents a methyl group or an ethyl group and $R^{32}$ and $R^{33}$ are bonded to each other to form the cycloalkyl group is preferable.

In Formula (Y3), $R^{36}$ and $R^{37}$ each independently represent a hydrogen atom, an alkyl group, or an aryl group, at least one of $R^{36}$ or $R^{37}$ represents an alkyl group or an aryl group, $R^{38}$ represents an alkyl group or an aryl group, and $R^{36}$ or $R^{37}$ may be bonded to $R^{38}$ to form a ring. The alkyl group may be linear, branched, or cyclic. The number of carbon atoms in the alkyl group is preferably 1 to 12, more preferably 1 to 6, and still more preferably 1 to 4. It is preferable that one of $R^{36}$ or $R^{37}$ represents a hydrogen atom. Examples of the ring which is formed by $R^{36}$ or $R^{37}$ being bonded to $R^{38}$ include a tetrahydrofuranyl group and a tetrahydropyranyl group.

In Formula (Y4), Ar represents an aromatic ring group, Rn represents an alkyl group or an aryl group. Rn and Ar may be bonded to each other to form a ring. It is preferable that the aromatic ring group represented by Ar is an aryl group.

It is preferable that the repeating unit b1 is a repeating unit represented by the following Formula (b1-1) or Formula (b1-2).

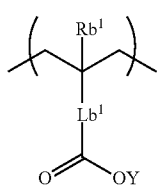

(b1-1)

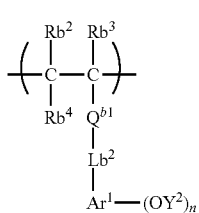

(b1-2)

In Formula (b1-1), $R^{b1}$ represents a hydrogen atom or an alkyl group. $Lb^1$ represents a single bond or a divalent linking group. Y represents an acid-decomposable group.

Examples of the divalent linking group represented by $Lb^1$ include an alkylene group, a —COO-Rt- group, and a —O-Rt- group. Rt represents an alkylene group having 1 to 5 carbon atoms. $Lb^1$ represents preferably a single bond or a —COO-Rt- group and more preferably a single bond.

It is preferable that Y represents any one of the groups represented by Formulae (Y1) to (Y4).

In Formula (b1-2), $Rb^2$ to $Rb^4$ each independently represent a hydrogen atom, an alkyl group, a halogen atom, a cyano group, or an alkoxycarbonyl group. $Rb^4$ may be bonded to Ar' to form a ring. $Q^{b1}$ represents a single bond, —COO—, or —CONR—. R represents a hydrogen atom or an alkyl group. $Lb^2$ represents a single bond or an alkylene group. $Ar^1$ represents a (n+1)-valent aromatic ring group, and in a case where Ar' is bonded to $Rb^4$ to form a ring, $Ar^1$ represents a (n+2)-valent aromatic ring group.

$Y^2$ represents a hydrogen atom or an acid-decomposable group. n represents an integer of 1 to 4. In a case where n represents 2 or more, a plurality of $Y^2$'s may be the same as or different from each other. In this case, at least one $Y^2$'s represents an acid-decomposable group. It is preferable that the acid-decomposable group is any one of the groups represented by Formulae (Y1) to (Y4).

It is preferable that the repeating unit b1 is a repeating unit represented by the following Formula b1-3.

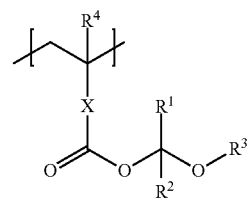

b1-3

In the formula, $R^1$ and $R^2$ each independently represent a hydrogen atom, an alkyl group, or an aryl group, at least one of $R^1$ or $R^2$ represents an alkyl group or an aryl group, $R^3$ represents an alkyl group or an aryl group, $R^1$ or $R^2$ may be bonded to $R^3$ to form a cyclic ether, $R^4$ represents a hydrogen atom or a methyl group, and X represents a single bond or a divalent linking group.

In a case where $R^1$ and $R^2$ represent an alkyl group, an alkyl group having 1 to 10 carbon atoms is preferable. In a case where $R^1$ and $R^2$ represent an aryl group, a phenyl group is preferable. $R^1$ and $R^2$ each independently represent a hydrogen atom or an alkyl group having 1 to 4 carbon atoms. $R^3$ represents an alkyl group or an aryl group, preferably an alkyl group having 1 to 10 carbon atoms, and more preferably an alkyl group having 1 to 6 carbon atoms. It is preferable that X represents a single bond.

Examples of the divalent linking group represented by X include the examples of the divalent linking group described above regarding $Lb^1$. It is preferable that X represents a single bond.

The details of the repeating unit b1 can be found in paragraphs "0056" to "0311" of WO2016/136481A and paragraphs "0040" to "0073" of JP2014-238438A, the contents of which are incorporated herein by reference.

(Repeating Unit b2)

The repeating unit b2 is a repeating unit having a cross-linking group. By the polymer component B including the polymer including the repeating unit b2, a cured film having excellent heat resistance can be formed.

The crosslinking group is not particularly limited as long as it is a group in which a start temperature of a crosslinking reaction during a heating treatment at 1 atm is 100° C. or higher. The start temperature of the crosslinking reaction can be analyzed using a well-known method, for example, can be analyzed with a method using differential scanning calorimetry (DSC). Examples of the crosslinking group include an epoxy group, an oxetanyl group, a methylol group, an alkoxymethylol group, a blocked isocyanate group, and an ethylenically unsaturated bond group. An epoxy group, an oxetanyl group, a methylol group, or an alkoxymethylol group is preferable, an epoxy group or an oxetanyl group is more preferable, and an epoxy group is still more preferable. The details of the repeating unit b2 can be found in paragraphs "0076" to "0087" of JP2014-238438A, the contents of which are incorporated herein by reference.

(Repeating Unit b3 Having Acid Group or Hydroxyl Group)

The polymer component B may include a polymer that includes a repeating unit b3 having an acid group or a hydroxyl group (hereinafter, also referred to as "repeating unit b3"). The repeating unit b3 may include any one of the polymers B1 to B3. In addition, a polymer other than the polymers B1 to B3 may include the repeating unit b3. By including the polymer including the repeating unit b3, the polymer component B is easily soluble in an alkali developer such that the developability is improved. Further, the sensitivity is also excellent.

Examples of the acid group or the hydroxyl group include a carboxyl group, an alcoholic hydroxyl group, a phenolic hydroxyl group, and a sulfonate group. A carboxyl group, an alcoholic hydroxyl group, or a phenolic hydroxyl group is preferable, and a carboxyl group or a phenolic hydroxyl group is more preferable.

As the repeating unit b3, a repeating unit derived from styrene, a repeating unit derived from a vinyl compound, or a repeating unit derived from (meth)acrylic acid is more preferable. The details of the repeating unit b3 can be found in paragraphs "0021" to "0023" and "0029" to "0044" of JP2012-088459A and paragraphs "0276" to "0300" of JP2014-232309A, the contents of which are incorporated herein by reference.

In a case where the polymer B1 further includes the repeating unit b3, the content of the repeating unit b3 is preferably 1 to 30 mol %, more preferably 3 to 20 mol %, and still more preferably 5 to 15 mol % with respect to all the repeating units of the polymer B1.

In a case where the polymer B2 or the polymer B3 includes the repeating unit b3, the content of the repeating unit b3 is preferably 1 to 50 mol %, more preferably 5 to 45 mol %, and still more preferably 10 to 40 mol % with respect to all the repeating units of the polymer B2 or the polymer B3.

In a case where the polymer including the repeating unit b3 does not include the repeating unit b1 and the repeating unit b2, the content of the repeating unit b3 is preferably 1 to 50 mol %, more preferably 2 to 40 mol %, and still more preferably 3 to 30 mol % with respect to all the repeating units of the polymer.

The content of the repeating unit b3 is preferably 1 to 30 mol %, more preferably 3 to 20 mol %, and still more preferably 5 to 15 mol % with respect to all the repeating units of the polymer component B.

(Other Repeating Unit b4)

The polymer component B may include a polymer including a repeating unit b4 other than the repeating units b1 to b3. The repeating unit b4 may be included in a polymer including any one of the repeating units b1 to b3 or may be included in a polymer not including all the repeating units b1 to b3. Examples of the repeating unit b4 include a repeating unit having a lactone group or a sultone group, a repeating unit including a plurality of aromatic rings, and a repeating unit derived from an alkyl (meth)acrylate. Examples of the alkyl (meth)acrylate include methyl (meth)acrylate, ethyl (meth)acrylate, propyl (meth)acrylate, and n-butyl (meth)acrylate.

As the lactone group or the sultone group, any group may be used as long as it has a lactone structure or a sultone structure. In particular, a group having a 5- to 7-membered lactone structure or sultone structure is preferable. In this case, it is preferable that another ring structure may be fused to group having a 5- to 7-membered lactone structure or sultone structure to form a bicyclo structure or a spiro structure. The details of the repeating unit having a lactone group or a sultone group can be found in paragraphs "0301" to "0314" of JP2014-232309A, the content of which is incorporated herein by reference.

Examples of the repeating unit having an aromatic ring group include a repeating unit represented by the following Formula (X).

(X)

In Formula (X), $R_{61}$, $R_{62}$, and $R_{63}$ each independently represent a hydrogen atom, an alkyl group, a cycloalkyl group, a halogen atom, a cyano group, or an alkoxycarbonyl group. $R^{63}$ may be bonded to Ar to form a ring. Ar represents a (n+1)-valent aromatic ring group, and in a case where Ar is bonded to $R_{63}$ to form a ring, Ar represents a (n+2)-valent aromatic ring group. $R_7$ represents an alkyl group having 1 to 10 carbon atoms, an alkoxy group, an acyloxy group, a cyano group, a nitro group, an amino group, a halogen atom, an ester group (—OCOR or —COOR: R represents an alkyl group having 1 to 6 carbon atoms or a fluorinated alkyl group), or a carboxyl group. n represents an integer of 0 or more. The details of the repeating unit represented by Formula (X) can be found in paragraphs "0318" to "0332" of JP2014-232309A, the content of which is incorporated herein by reference.

The content of the repeating unit b4 is preferably 50 mol % or lower, more preferably 40 mol % or lower, and still more preferably 30 mol % or lower with respect to all the repeating units of the polymer component B. The lower limit value may be 0 mol % and may be, for example, 1 mol % or higher.

In the photosensitive composition according to the embodiment of the present invention, the content of the polymer component B is preferably 10 to 99 mass % with respect to the solid content of the photosensitive composition. The lower limit is 20 mass % or higher and more preferably 30 mass % or higher. The upper limit is 95 mass % or lower and more preferably 90 mass % or lower.

<<Photoacid Generator>>

The photosensitive composition according to the embodiment of the present invention includes a photoacid generator. It is preferable that the photoacid generator is a compound that reacts with an actinic ray having a wavelength of 300 nm or longer and preferably 300 to 450 nm to produce an acid. In addition, even a photoacid generator that does not directly react with an actinic ray having a wavelength of 300 nm or longer can be preferably used in combination with a sensitizer as long as it is a compound that reacts with an actinic ray having a wavelength of 300 nm or longer to produce an acid by using a sensitizer in combination. As the photoacid generator used in the present invention, a photoacid generator that produces an acid having a pKa of 4 or lower is preferable, a photoacid generator having a pKa of 3 or lower is more preferable, and a photoacid generator having a pKa of 2 or lower is most preferable. In the present invention, basically, pKa refers to a value measured in water at 25° C. In a case where the pKa of a photoacid generator cannot be measured in water, the pKa refers to a value measured in a solvent that is suitable for the measurement. Specifically, the pKa described in Handbook of Chemistry or the like can be referred to. As the acid having a pKa of 4 or lower, sulfonic acid or phosphonic acid is preferable, and sulfonic acid is more preferable.

Examples of the photoacid generator include an onium salt compound, a trichloromethyl-s-triazine, a sulfonium salt, an iodonium salt, a quaternary ammonium salt, a diazomethane compound, an imide sulfonate compound, and an oxime sulfonate compound. Among these, an onium salt compound, an imide sulfonate compound, or an oxime sulfonate compound is preferable, an onium salt compound or an oxime sulfonate compound is more preferable, and an oxime sulfonate compound is still more preferable. The details of the photoacid generator can be found in paragraphs "0082" to "0172" of JP2011-221494A, paragraphs "0084" to "0122" of JP2016-189006A, paragraphs "0440" to "0509" of WO2016/136481A, and paragraphs "0048" to "0055" of JP2016-206503A, the contents of which are incorporated herein by reference. As the sulfonium salt, a compound having the following structure can also be used.

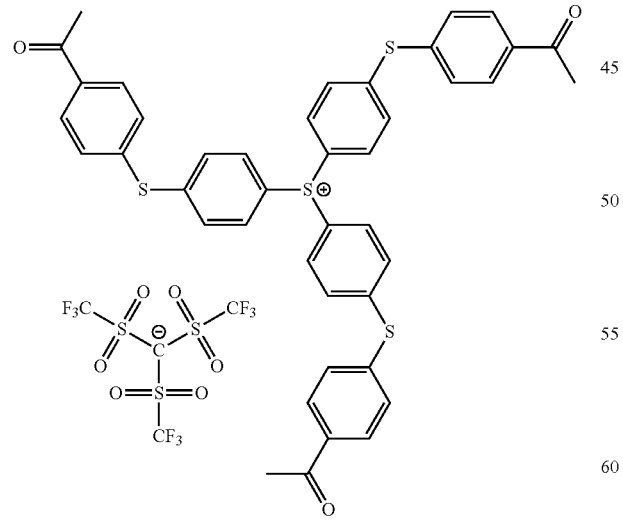

In the present invention, preferable examples of the oxime sulfonate compound include a compound having an oxime sulfonate structure represented by the following Formula (OS-1).

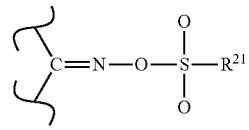

Formula (OS-1)

In Formula (OS-1), $R^{21}$ represents an alkyl group or an aryl group. A wave line represents a direct bond to another group or an atom constituting the oxime sulfonate compound.

The alkyl group or the aryl group represented by $R^{21}$ in Formula (OS-1) may have a substituent or may be unsubstituted. In a case where $R^{21}$ represents an alkyl group, it is preferable that $R^{21}$ represents a linear or branched alkyl group having 1 to 10 carbon atoms. The alkyl group represented by $R^{21}$ may be substituted with a halogen atom, an aryl group having 6 to 11 carbon atoms, an alkoxy group having 1 to 10 carbon atoms, or a cyclic alkyl group (including a bridged alicyclic group such as a 7,7-dimethyl-2-oxonorbornyl group; preferably a bicycloalkyl group). In a case where $R^{21}$ represents an aryl group, $R^{21}$ represents preferably an aryl group having 6 to 11 carbon atoms and more preferably a phenyl group or a naphthyl group. The aryl group represented by $R^{21}$ may be substituted with an alkyl group, an alkoxy group, or a halogen atom. The details of the compound having an oxime sulfonate structure represented by Formula (OS-1) can be found in paragraphs "0071" to "0087" of WO2015/033879A and paragraphs "0108" to "0133" of JP2014-238438A, the contents of which are incorporated herein by reference. Specific examples of the compound having an oxime sulfonate structure represented by Formula (OS-1) include a compound having the following structure and a compound described below in Examples.

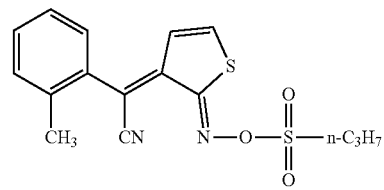

In the photosensitive composition according to the embodiment of the present invention, the content of the photoacid generator is preferably 0.1 to 20 mass % with respect to the total solid content of the photosensitive composition. For example, the lower limit is more preferably 0.2 mass % or higher and still more preferably 0.5 mass % or higher. For example, the upper limit is more preferably 10 mass % or lower and still more preferably 5 mass % or lower.

In addition, the content of the photoacid generator is preferably 0.1 to 10 parts by mass and more preferably 1 to 5 parts by mass with respect to 100 parts by mass of the polymer component B.

<<Compound (Crosslinking Agent) Having Molecular Weight of 1000 or Lower that has Crosslinking Group>>

The photosensitive composition according to the embodiment of the present invention may include a compound (hereinafter, also referred to as "crosslinking agent") having a molecular weight of 1000 or lower that has a crosslinking group. By the photosensitive composition according to the embodiment of the present invention including the crosslinking agent, a stronger cured film can be obtained. In particular, in a case where the polymer component B does not include a polymer that includes a repeating unit having a crosslinking group or the content of the polymer in the polymer component B is low, it is preferable that the polymer component B includes the crosslinking agent. The crosslinking agent is not particularly limited as long as it causes a crosslinking reaction by heat. For example, a compound having one or more groups of at least one kind selected from an epoxy group, an oxetanyl group, a methylol group, an alkoxymethylol group, a blocked isocyanate group, or an ethylenically unsaturated bond group can be used, a compound having one or more groups of at least one kind selected from an epoxy group, an oxetanyl group, a methylol group, or an alkoxymethylol group is preferable, and a compound having one or more epoxy groups and/or one or more oxetanyl groups is more preferable.

Examples of the compound having an epoxy group and/or an oxetanyl group include a bisphenol A epoxy resin, a bisphenol F epoxy resin, a phenol novolac epoxy resin, a cresol novolac epoxy resin, and an aliphatic epoxy resin. As the compound having an epoxy group and/or an oxetanyl group, a commercially available product can also be used. Examples of a commercially available product of the compound having an epoxy group an/dor an oxetanyl group include JER YX4000HK (manufactured by Mitsubishi Chemical Corporation, a biphenyl type bifunctional epoxy) and JER 1031S (manufactured by Mitsubishi Chemical Corporation, a tetrafunctional epoxy). In addition, the details of the compound having an epoxy group an/dor an oxetanyl group can be found in paragraph "0104" of WO2015/033879A and paragraphs "0098" to "0101" of JP2016-206503A, the contents of which are incorporated herein by reference.

It is preferable that the compound having a blocked isocyanate group (also referred to as "blocked isocyanate compound") is a compound having two or more blocked isocyanate groups in one molecule. In the present invention, the blocked isocyanate group refers to a group that can produce an isocyanate group by heat, and preferable examples thereof include a group in which a blocking agent and an isocyanate group are caused to react with each other to protect an isocyanate group. In addition, it is preferable that the blocked isocyanate group is a group capable of producing an isocyanate group by heat at 90° C. to 250° C. Examples of a mother structure of the blocked isocyanate compound include a biuret type, an isocyanurate type, an adduct type, and a bifunctional prepolymer type. Examples of the blocking agent that forms the block structure of the blocked isocyanate compound include an oxime compound, a lactam compound, a phenol compound, an alcohol compound, an amine compound, an active methylene compound, a pyrazole compound, a mercaptan compound, an imidazole compound, and an imide compound. Among these, a blocking agent selected from an oxime compound, a lactam compound, a phenol compound, an alcohol compound, an amine compound, an active methylene compound, or a pyrazole compound is more preferable. The details of the blocked isocyanate compound can be found in paragraphs "0106" to "0108" of WO2015/033879A, the content of which is incorporated herein by reference.

Examples of the compound having a methylol group and/or an alkoxymethylol group include alkoxy methylated melamine, alkoxy methylated benzoguanamine, alkoxy methylated glycoluril, and alkoxy methylated urea. These examples can be obtained by converting a methylol group of methylolated melamine, methylolated benzoguanamine, methylolated glycoluril, or methylolated urea into an alkoxymethyl group. The details of the compound having a methylol group and/or an alkoxymethylol group can be found in paragraphs "0051" to "0119" of WO2016/054625A, the content of which is incorporated herein by reference.

Examples of the ethylenically unsaturated bond group in the compound having an ethylenically unsaturated bond group include a vinyl group, a styrene group, a (meth)allyl group, and a (meth)acryloyl group. Among these, a (meth) acryloyl group is preferable. The compound having an ethylenically unsaturated bond group is preferably a (meth) acrylate compound having 3 to 15 functional groups and more preferably a (meth)acrylate compound having 3 to 6 functional groups. The details of the compound having an ethylenically unsaturated bond group can be found in paragraphs "0147" to "0150" of WO2016/158818A, the content of which is incorporated herein by reference.

In the present invention, the molecular weight of the crosslinking agent is preferably 200 to 1000.

In a case where the photosensitive composition according to the embodiment of the present invention includes the crosslinking agent, the content of the crosslinking agent is preferably 0.01 to 50 parts by mass, more preferably 0.1 to 30 parts by mass, and still more preferably 0.5 to 25 parts by mass with respect to 100 parts by mass of the polymer component B. By adding the crosslinking agent in the above-described range, a cured film having excellent mechanical strength and solvent resistance can be obtained. The photosensitive composition may include only one crosslinking agent or two or more crosslinking agents. In a case where the composition includes two or more crosslinking agents, it is preferable that the total content of the two or more crosslinking agents is in the above-described range.

<<Compound (Compound E) Having Molecular Weight of 1000 or Lower that has Group in which at Least One Group Selected from Acid Group or Hydroxyl Group is Protected by Acid-Decomposable Group>>

The photosensitive composition according to the embodiment of the present invention may further include a compound (hereinafter, also referred to as "compound E") having a molecular weight of 1000 or lower that has a group in which at least one group selected from an acid group or a hydroxyl group is protected by an acid-decomposable group. The compound E function to enhance the solubility in a developer in an exposed portion. The compound E in the present invention is a component different from the polymer component B.

Examples of the acid group and the hydroxyl group include a carboxyl group, an alcoholic hydroxyl group, a phenolic hydroxyl group, and a sulfonate group.

The acid-decomposable group is not particularly limited as long as it is a group that is decomposed due to the action of an acid. Examples of the acid-decomposable group include the groups represented by Formulae (Y1) to (Y4) described regarding the polymer component B. Specific examples of the acid-decomposable group include a tert-butoxycarbonyl group, an isopropoxycarbonyl group, a tetrahydropyranyl group, a tetrahydrofuranyl group, an ethoxyethyl group, a methoxyethyl group, an ethoxymethyl group, a trimethylsilyl group, a tert-butoxycarbonylmethyl group, and a trimethylsilyl ether group. From the viewpoint of sensitivity, an ethoxyethyl group or a tetrahydrofuranyl group is preferable.

The molecular weight of the compound E is preferably 150 to 1000 and more preferably 300 to 1000.

From the viewpoint of improving the dissolution inhibiting ability of the composition, it is preferable that the compound E is a compound having any one of an aromatic ring, a heterocycle, or an alicyclic structure. In addition, from the viewpoint of improving the sensitivity of the composition, it is preferable that the compound E is a compound having two or more acid groups or two or more hydroxyl groups protected in a molecule. It is preferable that the compound E is a compound represented by the following Formula (E1).

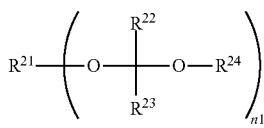

In Formula (E1), $R^{21}$ represents a monovalent to hexavalent organic group, $R^{22}$ and $R^{23}$ each independently represent a hydrogen atom, an alkyl group, or an aryl group, any one of $R^{22}$ or $R^{23}$ represents an alkyl group or an aryl group, $R^{24}$ represents an alkyl group or an aryl group, $R^{24}$ may be bonded to $R^{22}$ or $R^{23}$ to form a cyclic ether, and n1 represents an integer of 1 to 6.

$R^{22}$ and $R^{23}$ each independently represent a hydrogen atom, an alkyl group, or an aryl group, and any one of $R^{22}$ or $R^{23}$ represents an alkyl group or an aryl group. The number of carbon atoms in the alkyl group is preferably 1 to 10, more preferably 1 to 8, still more preferably 1 to 6, and still more preferably 1 to 4. In addition, the alkyl group may be linear, branched, or cyclic and is preferably a linear alkyl group. The number of carbon atoms in the aryl group is preferably 6 to 20, more preferably 6 to 14, and still more preferably 6 to 10.

$R^{24}$ represents an alkyl group or an aryl group. The number of carbon atoms in the alkyl group is preferably 1 to 16, more preferably 1 to 10, still more preferably 1 to 6, and still more preferably 1 to 4. The number of carbon atoms in the aryl group is preferably 6 to 20, more preferably 6 to 14, and still more preferably 6 to 10.

$R^{24}$ may be bonded to $R^{22}$ or $R^{23}$ to form a cyclic ether. As the cyclic ether which is formed by $R^{24}$ being bonded to $R^{22}$ or $R^{23}$ to form a cyclic ether, a cyclic ether having a 3- to 6-membered ring is preferable and a cyclic ether having a 5- or 6-membered ring is more preferable.

It is preferable that $R^{22}$ and $R^{23}$ represents a hydrogen atom or an alkyl group having 1 to 4 carbon atoms. In addition, it is preferable that $R^{24}$ represents an alkyl group having 1 to 4 carbon atoms or is bonded to $R^{22}$ or $R^{23}$ to form a tetrahydrofuranyl group.

The groups represented by $R^{22}$ to $R^{24}$ may have a substituent. Examples of the substituent include an alkyl group having 1 to 6 carbon atoms and a halogen atom (a fluorine atom, a chlorine atom, a bromine atom, or an iodine atom). These substituents may further have a substituent.

$R^{21}$ represents a monovalent to hexavalent organic group. The organic group represented by $R^{21}$ is preferably an organic group that includes an aromatic ring or a heterocycle and includes nothing but C, H, O, N atoms, more preferably an organic group that has a cyclic structure and/or a carbonyl group, and still more preferably a group having a combination of an aromatic group, a cyclic aliphatic group, a carbonyl group, an alkylene group, a phenylene group, and an oxygen atom.

Examples of the compound E include a compound having the following structure and a compound described below in Examples. The details of the compound E can be found in paragraphs "0018" to "0025" of JP2001-083709A and paragraphs "0116" to "0131" of JP2016-043203A, the contents of which are incorporated herein by reference.

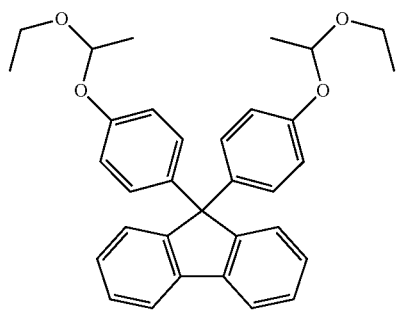

In a case where the photosensitive composition according to the embodiment of the present invention includes the compound E, the content of the compound E is preferably 5 to 50 parts by mass and more preferably 10 to 40 parts by mass with respect to 100 parts by mass of the polymer component B. The photosensitive composition may include only one compound E or two or more compounds E. In a case where the composition includes two or more compounds E, it is preferable that the total content of the two or more compounds E is in the above-described range.

<<Solvent>>

The photosensitive composition according to the embodiment of the present invention may include a solvent. Examples of the solvent include an organic solvent. The solvent is not particularly limited as long as it satisfies the solubility of the respective components and the application properties of the photosensitive composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 µm or less, more preferably 5 µm or less, and still more preferably 3 µm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 90 mass %, more preferably 20 to 80 mass %, and still more preferably 25 to 75 mass % with respect to the total mass of the photosensitive composition.

<<Chromatic Colorant>>

The photosensitive composition according to the embodiment of the present invention may include a chromatic colorant. In the present invention, "chromatic colorant" denotes a colorant other than a white colorant and a black colorant. It is preferable that the chromatic colorant is a colorant having an absorption in a wavelength range of 400 nm or longer and shorter than 650 nm.

In the present invention, the chromatic colorant may be a pigment or a dye. As the pigment, an organic pigment is preferable. Preferable examples of the organic pigment are as follows:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments); C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-34966A can also be used.

In a case where the photosensitive composition according to the embodiment of the present invention includes a chromatic colorant, the content of the chromatic colorant is preferably 60 mass % or lower, more preferably 50 mass % or lower, still more preferably 30 mass % or lower, still more preferably 20 mass % or lower, and still more preferably 15 mass % or lower with respect to the total solid content of the photosensitive composition. The lower limit is, for example, 0.01 mass % or higher or 0.5 mass % or higher.

<<Coloring Material that Allows Transmission of Infrared Light and Shields Visible Light>>

The photosensitive composition according to the embodiment of the present invention may also include the coloring material that allows transmission of infrared light and shields visible light (hereinafter, also referred to as "coloring material that shields visible light").

In the present invention, it is preferable that the coloring material that shields visible light is a coloring material that absorbs light in a wavelength range of violet to red. In addition, in the present invention, it is preferable that the coloring material that shields visible light is a coloring material that shields light in a wavelength range of 450 to 650 nm. In addition, it is preferable that the coloring material that shields visible light is a coloring material that allows transmission of light in a wavelength range of 900 to 1300 nm.

In the present invention, it is preferable that the coloring material that shields visible light satisfies at least one of the following requirement (A) or (B).

(A): The coloring material that shields visible light includes two or more chromatic colorants, and a combination of the two or more chromatic colorants forms black.

(B): The coloring material that shields visible light includes an organic black colorant.

Examples of the chromatic colorant are as described above. Examples of the organic black colorant include a bisbenzofuranone compound, an azomethine compound, a perylene compound, and an azo compound. Examples of the bisbenzofuranone compound include a compound described in JP2010-534726A, JP2012-515233A, and JP2012-515234A. For example, "Irgaphor Black" (manufactured by BASF SE) is available. Examples of the perylene compound include C.I. Pigment Black 31 and 32. Examples of the azomethine compound include a compound described in JP1989-170601A (JP-H1-170601A) and JP1990-34664A (JP-H2-34664A). For example, "CHROMOFINE BLACK A1103" (manufactured by Dainichiseika Color & Chemicals Mfg. Co., Ltd.) is available.

In a case where a combination of two or more chromatic colorants forms black, examples of the combination of chromatic colorants are as follows.

(1) An aspect in which the coloring material that shields visible light includes a yellow colorant, a blue colorant, a violet colorant, and a red colorant (2) An aspect in which the coloring material that shields visible light includes a yellow colorant, a blue colorant, and a red colorant (3) An aspect in which the coloring material that shields visible light includes a yellow colorant, a violet colorant, and a red colorant (4) An aspect in which the coloring material that shields visible light includes a yellow colorant and a violet colorant (5) An aspect in which the coloring material that shields visible light includes a green colorant, a blue colorant, a violet colorant, and a red colorant (6) An aspect in which the coloring material that shields visible light includes a violet colorant and an orange colorant (7) An aspect in which the coloring material that shields visible light includes a green colorant, a violet colorant, and a red colorant (8) An aspect in which the coloring material that shields light in the visible range includes a green colorant and a red colorant In a case where the photosensitive composition according to the embodiment of the present invention includes the coloring material that shields visible light, the content of the coloring material that shields visible light is preferably 60 mass % or lower, more preferably 50 mass % or lower, still more preferably 30 mass % or lower, still more preferably 20 mass % or lower, and still more preferably 15 mass % or lower with respect to the total solid content of the photosensitive composition. The lower limit is, for example, 0.01 mass % or higher or 0.5 mass % or higher.

<<Dispersant>>

The photosensitive composition according to the embodiment of the present invention may include a resin as a dispersant in addition to the polymer component B. Examples of the dispersant include an acidic dispersant (acidic resin) and a basic dispersant (basic resin). Here, the acidic dispersant (acidic resin) refers to a resin in which the amount of an acid group is more than the amount of a basic group. In a case where the sum of the amount of an acid group and the amount of a basic group in the acidic dispersant (acidic resin) is represented by 100 mol %, the amount of the acid group in the acidic resin is preferably 70 mol % or higher and more preferably substantially 100 mol %. The acid group in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group in the basic resin is preferably higher than 50 mol %. The basic group in the basic dispersant is preferably an amino group.

It is also preferable that the dispersant is a graft copolymer. The details of the graft copolymer can be found in the description of paragraphs "0025" to "0094" of JP2012-255128A, the content of which is incorporated herein by reference.

In addition, in the present invention, as dispersant, an oligoimine dispersant having a nitrogen atom at at least either a main chain or a side chain is also preferably used. As the oligoimine dispersant, a resin, which includes a structural unit having a partial structure X with a functional group (pKa: 14 or lower) and a side chain Y having 40 to 10000 atoms and has a basic nitrogen atom at at least either a main chain or a side chain, is preferable. The basic nitrogen atom is not particularly limited as long as it is a nitrogen atom exhibiting basicity. The oligoimine dispersant can be found in the description of paragraphs "0102" to "0166" of JP2012-255128A, the content of which is incorporated herein by reference. Examples of the oligoimine dispersant include a resin having the following structure. In addition, a resin described in paragraphs "0168" to "0174" of JP2012-255128A can be used.

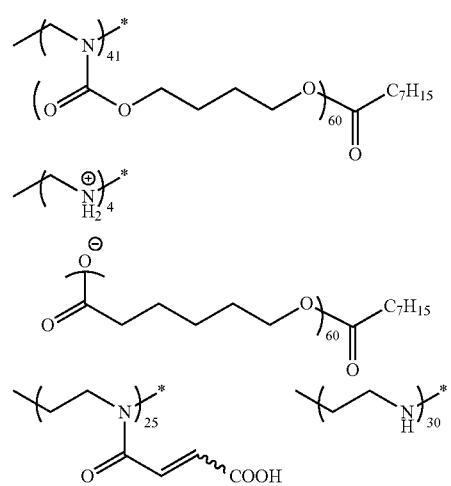

The dispersant is available as a commercially available product, and specific examples thereof include Disperbyk-111 (manufactured by BYK Chemie) and SOLSPERSE 76500 (manufactured by Lubrication Technology Inc.). In addition, a pigment dispersant described in paragraphs "0041" to "0130" of JP2014-130338A can also be used, the content of which is incorporated herein by reference. In addition, the resin having an acid group or the like can also be used as a dispersant.

In a case where the photosensitive composition according to the embodiment of the present invention includes a dispersant, the content of the dispersant is preferably 0.1 to 40 mass % with respect to the total solid content of the photosensitive composition. The lower limit is preferably 0.5 mass % or higher and more preferably 1 mass % or higher. The upper limit is preferably 20 mass % or lower, and more preferably 10 mass % or lower. The content of the dispersant is preferably 1 to 100 parts by mass with respect to 100 parts by mass of the pigment. The upper limit is preferably 80 parts by mass or less and more preferably 60 parts by mass or less. The lower limit is preferably 2.5 parts by mass and more preferably 5 parts by mass.

<<Pigment Derivative>>

The photosensitive composition according to the embodiment of the present invention may include a pigment derivative. Examples of the pigment derivative include a compound having a structure in which a portion of a pigment is substituted with an acid group, a basic group, a group having a salt structure, or a phthalimidomethyl group. As the pigment derivative, a compound represented by Formula (B1) is preferable.

In Formula (B1), P represents a colorant structure, L represents a single bond or a linking group, X represents an acid group, a basic group, a group having a salt structure, or a phthalimidomethyl group, m represents an integer of 1 or more, n represents an integer of 1 or more, in a case where m represents 2 or more, a plurality of L's and a plurality of X's may be different from each other, and in a case where n represents 2 or more, a plurality of X's may be different from each other.

In Formula (B1), P represents a colorant structure, preferably at least one selected from a pyrrolopyrrole colorant structure, a diketo pyrrolopyrrole colorant structure, a quinacridone colorant structure, an anthraquinone colorant structure, a dianthraquinone colorant structure, a benzoisoindole colorant structure, a thiazine indigo colorant structure, an azo colorant structure, a quinophthalone colorant structure, a phthalocyanine colorant structure, a naphthalocyanine colorant structure, a dioxazine colorant structure, a perylene colorant structure, a perinone colorant structure, a benzimidazolone colorant structure, a benzothiazole colorant structure, a benzimidazole colorant structure, or a benzoxazole colorant structure, more preferably at least one selected from a pyrrolopyrrole colorant structure, a diketo pyrrolopyrrole colorant structure, a quinacridone colorant structure, or a benzimidazolone colorant structure, and still more preferably a pyrrolopyrrole colorant structure.

In Formula (B1), L represents a single bond or a linking group. The linking group is preferably a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent.

In Formula (B1), X represents an acid group, a basic group, a group having a salt structure, or a phthalimidomethyl group. Among these, an acid group or a basic group is preferable. Examples of the acid group include a carboxyl group and a sulfo group. Examples of the basic group include an amino group.

As the pigment derivative, for example, compounds described in JP1981-118462A (JP-S56-118462A), JP1988-264674A (JP-S63-264674A), JP1989-217077A (JP-H1-217077A), JP1991-009961A (JP-H3-009961A), JP1991-026767A (JP-H3-026767A), JP1991-153780A (JP-H3-153780A), JP1991-045662A (JP-H3-045662A), JP1992-285669A (JP-H4-285669A), JP1994-145546A (JP-H6-145546A), JP1994-212088A (JP-H6-212088A), JP1994-240158A (JP-H6-240158A), JP1998-030063A (JP-H10-030063A), JP1998-195326A (JP-H10-195326A), paragraphs "0086" to "0098" of WO2011/024896A, and paragraphs "0063" to "0094" of WO2012/102399A can be used, the contents of which are incorporated herein by reference.

In a case where the photosensitive composition according to the embodiment of the present invention includes the pigment derivative, the content of the pigment derivative is preferably 1 to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is in the above-described range, the pigment dispersibility can be improved, and aggregation of the pigment can be effectively suppressed. As the pigment derivative, one kind may be used alone, or two or more kinds may be used in combination. In a case where two or more pigment derivatives are used in combination, it is preferable that the total content of the two or more pigment derivatives is in the above-described range.

<<Basic Compound>>

The photosensitive composition according to the embodiment of the present invention may include a basic compound. Examples of the basic compound include an aliphatic amine, an aromatic amine, a heterocyclic amine, quaternary ammonium hydroxide, and a quaternary ammonium salt of carboxylic acid. The details of these compounds can be found in paragraphs "0519" to "0609" of WO2016/136481A, the content of which is incorporated herein by reference. In addition, a compound described in paragraphs "0204" to "0207" of JP2011-221494A can also be used.

In a case where the photosensitive composition according to the embodiment of the present invention includes a basic compound, the content of the basic compound is preferably 0.001 to 3 mass % and more preferably 0.005 to 1 mass % with respect to the mass of the total solid content of the photosensitive composition. As the basic compound, one kind may be used alone, or two or more kinds may be used in combination. In a case where two or more basic compounds are used in combination, it is preferable that the total content of the two or more basic compounds is in the above-described range.

<<Silane Coupling Agent>>

The photosensitive composition according to the embodiment of the present invention may include a silane coupling agent. In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. Examples of the functional group other than a hydrolyzable group include a vinyl group, a styrene group, a (meth)acryloyl group, a mercapto group, an epoxy group, an oxetanyl group, an amino group, an ureido group, a sulfide group, an isocyanate group, and a phenyl group. Among these, a (meth)acryloyl group or an epoxy group is preferable. Examples of the silane coupling agent include a compound described in paragraphs "0018" to "0036" of JP2009-288703A and a compound described in paragraphs "0056" to "0066" of JP2009-242604A, the contents of which are incorporated herein by reference.

The content of the silane coupling agent is preferably 0.01 to 15.0 mass % and more preferably 0.05 to 10.0 mass % with respect to the total solid content of the photosensitive composition. As the silane coupling agent, one kind may be used alone, or two or more kinds may be used. In a case where two or more silane coupling agents are used in combination, it is preferable that the total content of the two or more silane coupling agents is in the above-described range.

<<Surfactant>>

The composition according to the embodiment of the present invention may include a surfactant. As the surfactants, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A and paragraphs "0166" and "0167" of WO2016/158818A, the content of which is incorporated herein by reference.

In the present invention, it is preferable that the surfactant is a fluorine surfactant. By the photosensitive composition according to the embodiment of the present invention containing a fluorine surfactant, liquid characteristics (in particular, fluidity) are further improved, and liquid saving properties can be further improved. In addition, a film having reduced thickness unevenness can be formed.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-41318A (paragraphs "0060" to "0064" of corresponding WO2014/17669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R$^{30}$, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used. Examples of the block polymer include a compound described in JP2011-89090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

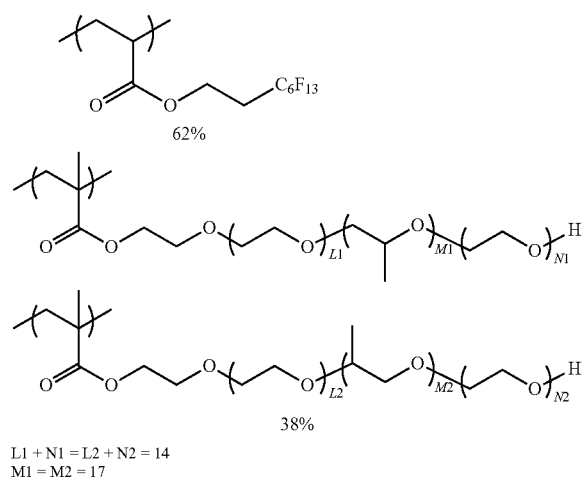

L1 + N1 = L2 + N2 = 14
M1 = M2 = 17

The weight-average molecular weight of the compound is preferably 3000 to 50000 and, for example, 14000. In the compound, "%" representing the proportion of a repeating unit is mol %.

In addition, as the fluorine surfactant, a fluorine-containing polymer having an ethylenically unsaturated group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters.

The content of the surfactant is preferably 0.001 mass % to 5.0 mass % and more preferably 0.005 to 3.0 mass % with respect to the total solid content of the photosensitive composition. As the surfactant, one kind may be used alone, or two or more kinds may be used. In a case where two or more surfactants are used in combination, it is preferable that the total content of the two or more surfactants is in the above-described range.

<<Ultraviolet Absorber>>

The photosensitive composition according to the embodiment of the present invention may include an ultraviolet absorber. As the ultraviolet absorber, for example, a conjugated diene compound, an aminobutadiene compound, a methyldibenzoyl compound, a coumarin compound, a salicylate compound, a benzophenone compound, a benzotriazole compound, an acrylonitrile compound, or a hydroxyphenyltriazine compound can be used. The details can be found in paragraphs "0052" to "0072" of JP2012-208374A and paragraphs "0317" to "0334" of JP2013-068814A, the contents of which are incorporated herein by reference. Examples of a commercially available product of the ultraviolet absorber include UV-503 (manufactured by Daito Chemical Co., Ltd.). In addition, as the benzotriazole compound, MYUA series (manufactured by Miyoshi Oil & Fat Co., Ltd.; The Chemical Daily, Feb. 1, 2016) may be used.

The content of the ultraviolet absorber is preferably 0.01 to 10 mass % and more preferably 0.01 to 5 mass % with respect to the total solid content of the photosensitive composition. In the present invention, as the ultraviolet absorber, one kind may be used alone, or two or more kinds may be used. In a case where two or ultraviolet absorbers are used in combination, it is preferable that the total content of the two or more ultraviolet absorbers is in the above-described range.

<<Antioxidant>>

The photosensitive composition according to the embodiment of the present invention may include an antioxidant. Examples of the antioxidant include a phenol compound, a phosphite compound, and a thioether compound. As the phenol compound, any phenol compound which is known as a phenol antioxidant can be used. As the phenol compound, for example, a hindered phenol compound is preferable. A compound having a substituent at a position (ortho position) adjacent to a phenolic hydroxyl group is preferable. As the substituent, a substituted or unsubstituted alkyl group having 1 to 22 carbon atoms is preferable. In addition, as the antioxidant, a compound having a phenol group and a phosphite group in the same molecule is also preferable. In addition, as the antioxidant, a phosphorus antioxidant can also be preferably used. Examples of the phosphorus antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-t-butyldibenzo[d,f][1,3,2]dioxaphosphepin-2-yl)oxy]ethyl]amine, and ethyl bis(2,4-di-t-butyl-6-methylphenyl)phosphite. Examples of a commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation).

In the photosensitive composition according to the embodiment of the present invention, the content of the antioxidant is preferably 0.01 to 20 mass % and more preferably 0.3 to 15 mass % with respect to the total solid content of the photosensitive composition. As the antioxidant, one kind may be used alone, or two or more kinds may be used in combination. In a case where two or more antioxidants are used in combination, it is preferable that the total content of the two or more antioxidants is in the above-described range.

<Other Components>

The photosensitive composition according to the embodiment of the present invention may optionally include a sensitizer, a thermal radical generator, a thermal acid generator, an acid proliferation agent, a development accelerator, a thickener, and a suspending agent. As these compounds, for example, compounds described in paragraphs "0201" to "0224" of JP2012-088459A and paragraphs "0099" to "0121" of WO2016/136481A can be used, and the contents of which are incorporated herein by reference.

For example, in a case where a film is formed by coating, the viscosity (23° C.) of the photosensitive composition according to the embodiment of the present invention is preferably 1 to 100 mPa·s. The lower limit is more preferably 2 mPa·s or higher and still more preferably 3 mPa·s or higher. The upper limit is more preferably 50 mPa·s or lower, still more preferably 30 mPa·s or lower, and still more preferably 15 mPa·s or lower.

A storage container of the photosensitive composition according to the embodiment of the present invention is not particularly limited, and a well-known storage container can be used. In addition, as the storage container, in order to suppress infiltration of impurities into the raw materials or the photosensitive composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

The use of the photosensitive composition according to the embodiment of the present invention is not particularly limited. The composition according to the embodiment of the present invention can be preferably used to form an infrared transmitting filter or the like.

<Method of Preparing Photosensitive Composition>

The photosensitive composition according to the embodiment of the present invention can be prepared by mixing the above-described components with each other. During the preparation of the photosensitive composition, all the components may be dissolved or dispersed in a solvent at the same time to prepare the photosensitive composition. Optionally, two or more solutions or dispersions to which the respective components are appropriately added may be prepared, and the solutions or dispersions may be mixed with each other during use (during application) to prepare the photosensitive composition.

In addition, in a case where the photosensitive composition according to the embodiment of the present invention includes particles of a pigment or the like, it is preferable that a process of dispersing the particles is provided. Examples of a mechanical force used for dispersing the particles in the process of dispersing the particles include compression, squeezing, impact, shearing, and cavitation. Specific examples of the process include a beads mill, a sand mill, a roll mill, a ball mill, a paint shaker, a Microfluidizer, a high-speed impeller, a sand grinder, a flow jet mixer, high-pressure wet atomization, and ultrasonic dispersion. During the pulverization of the particles using a sand mill (beads mill), it is preferable that the process is performed under conditions for increasing the pulverization efficiency, for example, by using beads having a small size and increasing the filling rate of the beads. In addition, it is preferable that rough particles are removed by filtering, centrifugal separation, and the like after pulverization. In addition, as the process and the disperser for dispersing the particles, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the particles, particles may be refined in a salt milling step. A material, a device, process conditions, and the like used in the salt milling step can be found in, for example, JP2015-194521A and JP2012-046629A.

During the preparation of the photosensitive composition, it is preferable that the photosensitive composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In a case where the pore size of the filter is in the above-described range, fine foreign matter can be reliably removed. In addition, it is preferable that a fibrous filter material is used. Examples of the fibrous filter material include polypropylene fiber, nylon fiber, and glass fiber. Specific examples include a filter cartridge of SBP type series (for example, SBP008), TPR type series (for example, TPR002 or TPR005), and SHPX type series (for example, SHPX003) all of which are manufactured by Roki Techno Co., Ltd.

In a case where a filter is used, a combination of different filters (for example, a first filter and a second filter) may be used. At this time, the filtering using each of the filters may be performed once, or twice or more.

In addition, a combination of filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

The second filter may be formed of the same material as that of the first filter.

In addition, the filtering using the first filter may be performed only on the dispersion, and the filtering using the second filter may be performed on a mixture of the dispersion and other components.

<Cured Film>

Next, a cured film according to the embodiment of the present invention will be described. The cured film according to the embodiment of the present invention is obtained from the above-described photosensitive composition according to the embodiment of the present invention. The cured film according to the embodiment of the present invention can be preferably used as a near infrared cut filter or an infrared transmitting filter. In a case where the cured film according to the embodiment of the present invention is used as an infrared transmitting filter, examples of the infrared transmitting filter include a filter that shields visible light and allows transmission of light in a wavelength range of 900 nm or longer. In a case where the cured film according to the embodiment of the present invention is used as an infrared transmitting filter, it is preferable that the cured film is a filter which is obtained using the photosensitive composition including the infrared shielding agent and the coloring material that shields visible light or is a filter in which a layer of the coloring material that shields visible light is separately present in addition to a layer including the infrared shielding agent. In a case where the film according to the embodiment of the present invention is used as an infrared transmitting filter, the infrared shielding agent has a function of limiting light to be transmitted (near infrared light) to a long wavelength side.

The thickness of the cured film according to the embodiment of the present invention can be adjusted according to the purpose. The thickness is preferably 20 µm or less, more preferably 10 µm or less, and still more preferably 5 µm or less. For example, the lower limit of the thickness is preferably 0.1 µm or more, more preferably 0.2 µm or more, and still more preferably 0.3 µm or more.

The cured film according to the embodiment of the present invention can be used in combination with a color filter that includes a chromatic colorant. For example, the cured film according to the embodiment of the present invention and the color filter can be laminated to be used as a laminate. In the laminate, the cured film according to the embodiment of the present invention and the color filter may be or may not be adjacent to each other in a thickness direction. In a case where the cured film according to the embodiment of the present invention is not adjacent to the color filter in the thickness direction, the cured film according to the embodiment of the present invention may be formed on another support other than a support on which the color filter is formed, or another member (for example, a microlens or a planarizing layer) constituting a solid image pickup element may be interposed between the cured film according to the embodiment of the present invention and the color filter.

In the present invention, "near infrared cut filter" refers to a filter that allows transmission of light (visible light) in the visible range and shields at least a part of light (near infrared light) in the near infrared range. The near infrared cut filter may be a filter that allows transmission of light in the entire wavelength range of the visible range, or may be a filter that allows transmission of light in a specific wavelength range of the visible range and shields light in another specific wavelength range of the visible range. In addition, in the present invention, a color filter refers to a filter that allows transmission of light in a specific wavelength range of the visible range and shields light in another specific wavelength range of the visible range. In addition, "infrared transmitting filter" refers to a filter that shields light in the visible range and allows transmission of at least a part of light (near infrared light) in the near infrared range.

In a case where the cured film according to the embodiment of the present invention is used as a near infrared cut filter, the average transmittance in a wavelength range of 400 to 550 nm is preferably 70% or higher, more preferably 80% or higher, still more preferably 85% or higher, and still more preferably 90% or higher. In addition, a transmittance of in the entire wavelength range of 400 to 550 nm is preferably 70% or higher, more preferably 80% or higher, and still more preferably 90% or higher. In addition, a preferable range of the near infrared shielding properties of the near infrared cut filter varies depending on the use. For example, a transmittance at at least one point in a wavelength range of 700 to 1000 nm is preferably 20% or lower, more preferably 15% or lower, and still more preferably 10% or lower.

In a case where the cured film according to the embodiment of the present invention is used as an infrared transmitting filter, it is preferable that a maximum value of a light transmittance of the film in a thickness direction in a wavelength range of 400 to 830 nm is 20% or lower and a minimum value of a light transmittance of the film in the thickness direction in a wavelength range of 1000 to 1300 nm is 80% or higher. The cured film having the above-described spectral characteristics can be preferably used as an infrared transmitting filter that shields light in a wavelength range of 400 to 750 nm and allows transmission of light in a wavelength range of 900 nm or longer.

The cured film according to the embodiment of the present invention can be used in various devices including a solid image pickup element such as a charge coupled device (CCD) or a complementary metal-oxide semiconductor (CMOS), an infrared sensor, or an image display device.

<Method of Forming Cured Film>

It is preferable that a method of forming the cured film according to the embodiment of the present invention includes the following steps A to C.

Step A: applying the photosensitive composition to a support to form a photosensitive composition layer Step B: exposing the photosensitive composition layer in a pattern shape Step C: developing the exposed photosensitive composition layer using a developer to form a positive image Step D: heating the developed positive image In Step A, the photosensitive composition is applied to a support to form a photosensitive composition layer. Examples of the support include a substrate formed of a material such as silicon, non-alkali glass, soda glass, PYREX (registered trade name) glass, or quartz glass. For example, an organic film or an inorganic film may be formed on the substrate. In addition, as the support, a substrate formed of the resin can also be used. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the substrate flat. In addition, in a case where a glass substrate is used as the support, it is preferable that an inorganic film is formed on the glass substrate or the glass substrate may be dealkalized to be used.

As a method of applying the photosensitive composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet— Infinite Possibilities in Patent-" (February, 2005, S.B. Research Co., Ltd.) and methods described in JP2003-262716A, JP2003-185831A, JP2003-261827A, JP2012-126830A, and JP2006-169325A.

The photosensitive composition may be dried (pre-baked) after being applied. The drying temperature is preferably 150° C. or lower, more preferably 120° C. or lower, and still more preferably 110° C. or lower. The lower limit is, for example, 50° C. or higher or 80° C. or higher. The drying time is preferably 10 to 3000 seconds, more preferably 40 to 2500 seconds, and still more preferably 80 to 2200 seconds. Drying can be performed using a hot plate, an oven, or the like.

In Step B, the photosensitive composition layer is exposed in a pattern shape. For example, the photosensitive composition layer can be exposed in a pattern shape using an exposure device such as a stepper through a mask having a predetermined mask pattern. In this step, the photoacid generator is decomposed by exposure to produce an acid. Due to the catalytic action of the produced acid, the acid-decomposable group in the repeating unit b1 included in the photosensitive composition layer is decomposed to produce an acid group or a hydroxyl group. As a result, the solubility of an exposed portion of the photosensitive composition layer in a developer deteriorates. As radiation (light) used during the exposure, ultraviolet rays such as g-rays or i-rays are preferable, and i-rays are more preferable. For example, the irradiation dose (exposure dose) is preferably 0.03 to 2.5 $J/cm^2$, more preferably 0.05 to 1.0 $J/cm^2$, and most preferably 0.08 to 0.5 $J/cm^2$. The oxygen concentration in the atmosphere during exposure can be appropriately selected. For example, the exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 $W/m^2$ to 100000 $W/m^2$ (for example, 5000 $W/m^2$, 15000 $W/m^2$, or 35000 $W/m^2$). Conditions of the oxygen concentration and conditions of the exposure illuminance may be appropriately combined. For example, conditions are oxygen concentration: 10 vol % and illuminance: 10000 $W/m^2$, or oxygen concentration: 35 vol % and illuminance: 20000 $W/m^2$.

In Step B, it is also preferable that a heating treatment is performed after the exposure. According to this aspect, the decomposition of the acid-decomposable group in the exposed portion can be accelerated. In a case where the heating treatment is performed after the exposure, the heating temperature is preferably 150° C. or lower, more preferably 120° C. or lower, and still more preferably 110° C. or lower. The lower limit is, for example, 50° C. or higher or 80° C. or higher. The heating time is preferably 10 to 3000 seconds, more preferably 40 to 2500 seconds, and still more preferably 80 to 2200 seconds. Drying can be performed using a hot plate, an oven, or the like.

In Step C, the exposed photosensitive composition layer is developed using a developer. As a result, the exposed portion of the photosensitive composition layer is removed such that a positive image is formed. As the developer, an organic solvent or an alkali developer can be used. As the organic solvent, a polar solvent such as a ketone solvent, an ester solvent, an alcohol solvent, an amide solvent, or an ether solvent or a hydrocarbon solvent can be used. As the alkali developer, an alkali aqueous solution including an alkali component selected from the following components can be used, the components including: an inorganic alkali such as sodium hydroxide, potassium hydroxide, sodium carbonate, sodium silicate, sodium metasilicate, or ammonia water; a primary amine such as ethylamine or n-propyl amine; a secondary amine such as diethylamine or di-n-butylamine; a tertiary amine such as triethylamine or methyldiethylamine; an alcohol amine such as dimethylethanolamine or triethanolamine; a tetraalkylammonium hydroxide such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, or dibutyldipentylammonium hydroxide; a quaternary ammonium salt such as trimethylphenylammonium hydroxide, trimethylbenzylammonium hydroxide, triethylbenzylammonium hydroxide, or dimethyl bis(2-hydroxyethyl)ammonium hydroxide; and a cyclic amine such as pyrrole or piperidine. The alkali developer can also be used after adding an appropriate amount of an alcohol and/or a surfactant. The alkali concentration in the alkali developer (the alkali component concentration with respect to the total mass of the alkali developer) is preferably 0.1 to 20 mass %. The pH of the alkali developer is preferably 10.0 to 15.0.

From the viewpoint of easiness of transport, storage, and the like, the developer may be obtained by temporarily preparing a concentrated solution and diluting the concentrated solution to a necessary dilution factor during use. The dilution factor is not particularly limited and, for example, can be set to be in a range of 1.5 to 100 times.

A development method is not particularly limited, and a well-known method can be used. For example, a dip method, a puddle method, a spraying method, or a dynamic dispense method can be used.

After the development using the developer, a rinsing treatment is performed. As the rinsing liquid, water or an organic solvent can be used. For example, in a case where the development is performed using the alkali developer, it is preferable that the rinsing treatment is performed using pure water.

In Step D, the developed positive image is heated (hereinafter, also referred to as "post-baking"). After post-baking the positive image, the acid-decomposable group is thermally decomposed to produce an acid group or a hydroxyl group such that the acid group or the hydroxyl group may be crosslinked with a crosslinking group in a polymer or a crosslinking agent or can promote a reaction between crosslinking groups. For example, the post-baking temperature is preferably 180° C. to 250° C. The post-baking time is preferably 5 to 120 minutes. Post-baking can be performed continuously or batchwise using heating means such as a hot plate, a convection oven (hot air circulation dryer), or a high-frequency heater. In addition, it is also preferable that post-baking is performed in a nitrogen atmosphere. According to this aspect, the transparency of the cured film can be further improved.

In addition, post-baking can also be performed after performing heating (middle-baking) at a relatively low temperature. In addition, it is also preferable that the developed positive image is exposed (post-exposure) before post-baking. As a result, an acid can be produced from the photoacid generator present in the developed positive image, a crosslinking reaction of the crosslinking group can be accelerated during post-baking, and the curing reaction of the film can be further accelerated. As conditions of middle-baking and post-exposure, conditions described in paragraph "0201" of JP2014-238438A can be used, the content of which is incorporated herein by reference.

<Optical Filter>

Next, an optical filter according to the embodiment of the present invention will be described. The optical filter according to the embodiment of to the present invention includes the cured film according to the embodiment of the present invention. The optical filter according to the embodiment of the present invention can be preferably used as at least one selected from a near infrared cut filter or an infrared transmitting filter. In addition, it is also preferable that the optical filter according to the embodiment of the present invention includes a pixel which is formed using the film according to the embodiment of the present invention and a pixel selected from the group consisting of a red pixel, a green pixel, a blue pixel, a magenta pixel, a yellow pixel, a cyan pixel, a black pixel, and an achromatic pixel.

In a case where the cured film according to the embodiment of the present invention is used as a near infrared cut filter, the near infrared cut filter may further include, for example, a layer containing copper, a dielectric multi-layer film, or an ultraviolet absorbing layer in addition to the cured film according to the embodiment of the present invention. By further including the layer containing copper and/or the dielectric multi-layer film, the near infrared cut filter having a viewing angle and excellent near infrared shielding properties can be easily obtained. In addition, by including the ultraviolet absorbing layer, the near infrared cut filter having excellent ultraviolet shielding properties can be obtained. The details of the ultraviolet absorbing layer can be found in, for example, the description of an absorbing layer described in paragraphs "0040" to "0070" and paragraphs "0119" to "0145" of WO2015/099060, the content of which is incorporated herein by reference. The details of the dielectric multi-layer film can be found in paragraphs "0255" to "0259" of JP2014-041318A, the content of which is incorporated herein by reference. As the layer containing copper, a glass substrate (copper-containing glass substrate) formed of glass containing copper, or a layer (copper complex-containing layer) containing a copper complex may also be used. Examples of the copper-containing glass substrate include a phosphate glass including copper and a fluorophosphate glass including copper. Examples of a commercially available product of the copper-containing glass include NF-50 (manufactured by AGC Techno Glass Co., Ltd.), BG-60 and BG-61 (both of which are manufactured by Schott AG), and CD5000 (manufactured by Hoya Corporation). Specific examples of the copper complex include compounds described in paragraphs "0009" to "0049" of WO2016/068037A, the content of which is incorporated herein by reference.

In a case where the cured film according to the embodiment of the present invention is used as a near infrared cut filter or an infrared transmitting filter, a near infrared cut filter and an infrared transmitting filter can be used in combination. By using a near infrared cut filter and an infrared transmitting filter in combination, this combination can be preferably used for an infrared sensor that detects infrared light at a specific wavelength. In a case where both a near infrared cut filter and an infrared transmitting filter are used in combination, either or both of the near infrared cut filter and the infrared transmitting filter can be formed using the photosensitive composition according to the embodiment of the present invention.

<Solid Image Pickup Element>

A solid image pickup element according to the embodiment of the present invention includes the cured film according to the embodiment of the present invention. The configuration of the solid image pickup element is not particularly limited as long as it includes the film according to the embodiment of the present invention and functions as a solid image pickup element. For example, the following configuration can be adopted.

The solid image pickup element includes plural photodiodes and transfers electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the cured film according to the embodiment of the present invention is formed on the device protective film. Further, a configuration in which light collecting means (for example, a microlens; hereinafter, the same shall be applied) is provided above the device protective film and below the cured film according to the present invention (on a side thereof close the support), or a configuration in which light collecting means is provided on the cured film according to the present invention may be adopted. In addition, the color filter may have a structure in which a film which forms each pixel is embedded in a space which is partitioned in, for example, a lattice shape by a partition wall. In this case, it is preferable that the partition wall has a lower refractive index than each pixel. Examples of an imaging device having such a structure include a device described in JP2012-227478A and JP2014-179577A.

<Image Display Device>

An image display device according to the embodiment of the present invention includes the cured film according to the embodiment of the present invention. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-45676A, or pp. 326-328 of "Forefront of Organic EL Technology Development-Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Infrared Sensor>

An infrared sensor according to the embodiment of the present invention includes the cured film according to the embodiment of the present invention. The configuration of the infrared sensor is not particularly limited as long as it functions as an infrared sensor. Hereinafter, an embodiment of the infrared sensor used in the present invention will be described using the drawings.

In FIG. 1, reference numeral 110 represents a solid image pickup element. In an imaging region provided on a solid image pickup element 110, near infrared cut filters 111 and infrared transmitting filters 114 are provided. In addition, color filters 112 are laminated on the near infrared cut filters 111. Microlenses 115 are disposed on an incidence ray hυ side of the color filters 112 and the infrared transmitting filters 114. A planarizing layer 116 is formed so as to cover the microlenses 115.

The near infrared cut filter 111 can be formed using the photosensitive composition according to the embodiment of the present invention. Spectral characteristics of the near infrared cut filters 111 can be selected according to the emission wavelength of an infrared light emitting diode (infrared LED) to be used.

The color filters 112 is not particularly limited as long as pixels which allow transmission of light having a specific wavelength in a visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected according to the emission wavelength of the infrared LED to be used. For example, in a case where the emission wavelength of the infrared LED is 850 nm, a maximum value of a light transmittance of the infrared transmitting filter 114 in the thickness direction of the film in a wavelength range of 400 to 650 nm is preferably 30% or lower, more preferably 20% or lower, still more preferably 10% or lower and still more preferably 0.1% or lower. It is preferable that the transmittance satisfies the above-described conditions in the entire wavelength range of 400 to 650 nm.

A minimum value of a light transmittance of the infrared transmitting filter 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in a part of a wavelength range of 800 nm or longer, and it is more preferable that the transmittance satisfies the above-described conditions at a wavelength corresponding to the emission wavelength of the infrared LED.

The thickness of the infrared transmitting filter 114 is preferably 100 μm or less, more preferably 15 μm or less, still more preferably 5 μm or less, and still more preferably 1 μm or less. The lower limit value is preferably 0.1 μm. In a case where the thickness is in the above-described range, the film can satisfy the above-described spectral characteristics.

A method of measuring the spectral characteristics, the thickness, and the like of the infrared transmitting filter 114 are as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 to 1300 nm using an ultraviolet-visible-near infrared spectrophotometer (U-4100, manufactured by Hitachi High-Technologies Corporation).

In addition, for example, in a case where the emission wavelength of the infrared LED is 940 nm, it is preferable that a maximum value of a light transmittance of the infrared transmitting filter 114 in a thickness direction in a wavelength range of 450 to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1000 to 1300 nm is 70% or higher.

In the infrared sensor shown in FIG. 1, a near infrared cut filter (other near infrared cut filter) other than the near infrared cut filter 111 may be further disposed on the planarizing layer 116. As the other near infrared cut filter, for example, a layer containing copper and/or a dielectric multi-layer film may be provided. The details of the groups are as described above. In addition, as the other near infrared cut filter, a dual band pass filter may be used.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

<Measurement of Weight-Average Molecular Weight>

The weight-average molecular weight of the polymer was measured by gel permeation chromatography (GPC) using the following conditions.

Kind of column: a column in which TOSOH TSK gel Super HZM-H, TOSOH TSK gel Super HZ4000, and TOSOH TSK gel Super HZ2000 were linked to each other Developing solvent: tetrahydrofuran Column temperature: 40° C.

Flow rate (sample injection volume): 1.0 μL (sample concentration: 0.1 mass %)

Device name: HLC-8220 GPC (manufactured by Tosoh Corporation)

Detector: refractive index (RI) detector

Calibration curve base resin: a polystyrene resin

Test Example 1

Preparation of Photosensitive Composition

Examples 1 to 17, 20, and 21

The following raw materials were mixed and stirred, and the obtained mixture was filtered using a nylon filter (manufactured by Pall Corporation) having a pore size of 0.45 μm to prepare a photosensitive composition. In Example 13, as the infrared shielding agent, A-1 and A-6 were mixed at a mass ratio of A-1:A-6=1:1 and used. In Example 21, as the infrared shielding agent, A-13, A-14, and A-15 were mixed at a mass ratio of A-13:A-14:A-15=3:5:3 and used. In addition, in Example 17, as the polymer component, B2-1 and B3-1 were mixed at a mass ratio of B2-1:B3-1=1:1 and used.

| | |
|---|---|
| Infrared shielding agent (infrared shielding agent shown in the following table) | ... 2.54 parts by mass |
| Polymer component (polymer component shown in the following table) | ... 16.91 parts by mass |
| Photoacid generator (photoacid generator shown in the following table) | ... 0.34 parts by mass |
| Surfactant 1 | ... 0.02 parts by mass |
| Basic compound 1 | ... 0.02 parts by mass |
| Propylene Glycol Methyl Ether Acetate (PGMEA) | ... 80.18 parts by mass |

Example 22

10 parts by mass of an infrared shielding agent (pigment) A-16 having the following structure, 3 parts by mass of a pigment derivative a-1 having the following structure, 7.8 parts by mass of a dispersion resin F-1 having the following structure, 150 parts by mass of propylene glycol monomethyl ether acetate (PGMEA), and 230 parts by mass of zirconia beads having a diameter of 0.3 mm were mixed with each other, the mixture was dispersed using a paint shaker for 5 hours, and the beads were separated by filtration. As a result, a pigment dispersion composition was prepared.

The following raw materials were mixed and stirred, and the obtained mixture was filtered using a nylon filter (manufactured by Pall Corporation) having a pore size of 0.45 μm to prepare a photosensitive composition according to Example 22.

| | |
|---|---|
| Pigment dispersion composition | 33.37 parts by mass |
| Polymer B1-1 | ... 15.39 parts by mass |
| Photoacid generator C-1 | ... 0.34 parts by mass |
| Surfactant 1 | ... 0.02 parts by mass |
| Basic compound 1 | ... 0.02 parts by mass |
| Propylene Glycol Methyl Ether Acetate (PGMEA) | ... 50.86 parts by mass |

Examples 34 to 44, 49 to 52, 59 to 61, 66, 67, 69 and 70

The following raw materials were mixed and stirred, and the obtained mixture was filtered using a nylon filter (manufactured by Pall Corporation) having a pore size of 0.45 μm to prepare a photosensitive composition.

| | |
|---|---|
| Infrared shielding agent (infrared shielding agent shown in the following table) | ... 2.54 parts by mass |
| Polymer component (polymer component shown in the following table) | ... 16.90 parts by mass |
| Photoacid generator (photoacid generator shown in the following table) | ... 0.34 parts by mass |
| Basic compound (basic compound shown in the following table) | ... 0.02 parts by mass |
| Surfactant (surfactant shown in the following table) | ... 0.02 parts by mass |
| PGMEA | ... 80.18 parts by mass |

In Example 59, as the polymer component, B1-1 and B1-3 were mixed at a mass ratio of B1-1:B1-3=1:1 and used. In Example 60, as the polymer component, B1-1 and B3-1 were mixed at a mass ratio of B1-1:B3-1=4:1 and used. In Example 61, as the photoacid generator, C-1 and C-3 were mixed at a mass ratio of C-1:C-3=1:1 and used. In Example 66, as the infrared shielding agent, A-10 and A-11 were mixed at a mass ratio of A-10:A-11=1:1 and used. In Example 67, as the infrared shielding agent, A-10 and A-12 were mixed at a mass ratio of A-10:A-12=1:1 and used. In Example 69, as the infrared shielding agent, A-19 and A-20 were mixed at a mass ratio of A-19:A-20=1:1 and used. In Example 70, as the infrared shielding agent, A-21 and A-22 were mixed at a mass ratio of A-21:A-22=1:1 and used.

Examples 31 to 33, 53, 54, and 68

10 parts by mass of an infrared shielding agent shown in the following table, 3 parts by mass of a pigment derivative shown in the following tables, 7.8 parts by mass of a dispersion resin shown in the following tables, 150 parts by mass of propylene glycol monomethyl ether acetate (PGMEA), and 230 parts by mass of zirconia beads having a diameter of 0.3 mm were mixed with each other, the mixture was dispersed using a paint shaker for 5 hours, and the beads were separated by filtration. As a result, a pigment dispersion composition was prepared.

The following raw materials were mixed and stirred, and the obtained mixture was filtered using a nylon filter (manufactured by Pall Corporation) having a pore size of 0.45 μm to prepare a photosensitive composition.

| | |
|---|---|
| Pigment dispersion composition | 33.37 parts by mass |
| Polymer component (polymer component shown in the following table) | 15.39 parts by mass |
| Photoacid generator (photoacid generator shown in the following table) | 0.34 parts by mass |
| Basic compound (basic compound shown in the following table) | 0.02 parts by mass |
| Surfactant (surfactant shown in the following table) | 0.02 parts by mass |
| PGMEA | 50.86 parts by mass |

In Example 68, as the infrared shielding agent, A-16 and A-17 were mixed at a mass ratio of A-16:A-17=1:1 and used. As the pigment derivative, a-1 and a-3 were mixed at a mass ratio of a-1:a-3=1:1 and used.

Examples 18, 45 to 47, 62, and 65

The following raw materials were mixed and stirred, and the obtained mixture was filtered using a nylon filter (manufactured by Pall Corporation) having a pore size of 0.45 μm to prepare a photosensitive composition.

| | |
|---|---|
| Infrared shielding agent (infrared shielding agent shown in the following table) | 2.54 parts by mass |
| Polymer component (polymer component shown in the following table) | 14.08 parts by mass |
| Photoacid generator (photoacid generator shown in the following table) | 0.34 parts by mass |
| Crosslinking agent (crosslinking agent shown in the following table) | 2.82 parts by mass |
| Basic compound (basic compound shown in the following table) | 0.02 parts by mass |
| Surfactant (surfactant shown in the following table) | 0.02 parts by mass |
| PGMEA | 80.18 parts by mass |

In Example 62, as the crosslinking agent, D-1 and D-2 were mixed at a mass ratio of D-1:D-2=1:1 and used. In Example 65, as the crosslinking agent, D-1 and D-3 were mixed at a mass ratio of D-1:D-3=2:1 and used.

Examples 19, 48, 57, 58, and 63

The following raw materials were mixed and stirred, and the obtained mixture was filtered using a nylon filter (manufactured by Pall Corporation) having a pore size of 0.45 μm to prepare a photosensitive composition.

| | |
|---|---|
| Infrared shielding agent (infrared shielding agent shown in the following table) | 2.54 parts by mass |
| Polymer component (polymer component shown in the following table) | 14.08 parts by mass |
| Photoacid generator (photoacid generator shown in the following table) | 0.34 parts by mass |
| Compound E (compound E shown in the following table) | 2.82 parts by mass |
| Basic compound (basic compound shown in the following table) | 0.02 parts by mass |
| Surfactant (surfactant shown in the following table) | 0.02 parts by mass |
| PGMEA | 80.18 parts by mass |

In Example 63, as the crosslinking agent, E-1 and E-2 were mixed at a mass ratio of E-1:E-2=1:1 and used.

Examples 55 and 56

10 parts by mass of an infrared shielding agent (pigment) shown in the following table, 3 parts by mass of a pigment derivative shown in the following tables, 7.8 parts by mass of a dispersion resin shown in the following tables, 150 parts by mass of propylene glycol monomethyl ether acetate (PGMEA), and 230 parts by mass of zirconia beads having a diameter of 0.3 mm were mixed with each other, the mixture was dispersed using a paint shaker for 5 hours, and the beads were separated by filtration. As a result, a pigment dispersion composition was prepared.

The following raw materials were mixed and stirred, and the obtained mixture was filtered using a nylon filter (manufactured by Pall Corporation) having a pore size of 0.45 μm to prepare a photosensitive composition.

| | |
|---|---|
| Pigment dispersion composition | 33.37 parts by mass |
| Polymer component (polymer component shown in the following table) . . . | 12.83 parts by mass |
| Photoacid generator (photoacid generator shown in the following table) . . . | 0.34 parts by mass |
| Crosslinking agent (crosslinking agent shown in the following table) . . . | 2.56 parts by mass |
| Basic compound (basic compound shown in the following table) . . . | 0.02 parts by mass |
| Surfactant (surfactant shown in the following table) . . . | 0.02 parts by mass |
| PGMEA . . . | 50.86 parts by mass |

Example 64

The following raw materials were mixed and stirred, and the obtained mixture was filtered using a nylon filter (manufactured by Pall Corporation) having a pore size of 0.45 μm to prepare a photosensitive composition.

| | | |
|---|---|---|
| Infrared shielding agent A-25 | . . . | 2.54 parts by mass |
| Polymer B1-1 | . . . | 12.06 parts by mass |
| Photoacid generator C-1 | . . . | 0.34 parts by mass |
| Crosslinking agent D-1 | . . . | 2.42 parts by mass |
| Compound E-1 | . . . | 2.42 parts by mass |
| Basic compound 2 | . . . | 0.02 parts by mass |
| Surfactant 1 | . . . | 0.02 parts by mass |
| PGMEA | . . . | 80.18 parts by mass |

Comparative Example 1

The following raw materials were mixed and stirred, and the obtained mixture was filtered using a nylon filter (manufactured by Pall Corporation) having a pore size of 0.45 μm to prepare a photosensitive composition.

| | | |
|---|---|---|
| Infrared shielding agent A-1 | . . . | 2.54 parts by mass |
| Photoacid generator C-1 | . . . | 0.34 parts by mass |
| Crosslinking agent D-1 | . . . | 8.45 parts by mass |
| Compound E-1 | . . . | 8.45 parts by mass |
| Basic compound 1 | . . . | 0.02 parts by mass |
| Surfactant 1 | . . . | 0.02 parts by mass |
| PGMEA | . . . | 80.18 parts by mass |

TABLE 1

| | Infrared Shielding Agent A (Pigment Derivative a) | Polymer Component B | Photoacid Generator C | Crosslinking Agent D | Compound E | Dispersion Resin F | Basic Compound | Surfactant |
|---|---|---|---|---|---|---|---|---|
| Example 1 | A-1 | B1-1 | C-1 | — | — | — | 1 | 1 |
| Example 2 | A-2 | B1-1 | C-1 | — | — | — | 1 | 1 |
| Example 3 | A-3 | B1-1 | C-1 | — | — | — | 1 | 1 |
| Example 4 | A-4 | B1-1 | C-1 | — | — | — | 1 | 1 |
| Example 5 | A-5 | B1-1 | C-1 | — | — | — | 1 | 1 |
| Example 6 | A-6 | B1-1 | C-1 | — | — | — | 1 | 1 |
| Example 7 | A-7 | B1-1 | C-1 | — | — | — | 1 | 1 |
| Example 8 | A-8 | B1-1 | C-1 | — | — | — | 1 | 1 |
| Example 9 | A-9 | B1-1 | C-1 | — | — | — | 1 | 1 |
| Example 10 | A-10 | B1-1 | C-1 | — | — | — | 1 | 1 |
| Example 11 | A-11 | B1-1 | C-1 | — | — | — | 1 | 1 |
| Example 12 | A-12 | B1-1 | C-1 | — | — | — | 1 | 1 |
| Example 13 | A-1/A-6 | B1-1 | C-1 | — | — | — | 1 | 1 |
| Example 14 | A-1 | B1-2 | C-1 | — | — | — | 1 | 1 |
| Example 15 | A-1 | B1-3 | C-1 | — | — | — | 1 | 1 |
| Example 16 | A-1 | B1-4 | C-1 | — | — | — | 1 | 1 |
| Example 17 | A-1 | B2-1/B3-1 | C-1 | — | — | — | 1 | 1 |
| Example 18 | A-1 | B2-1 | C-1 | D-1 | — | — | 1 | 1 |

TABLE 1-continued

|  | Infrared Shielding Agent A (Pigment Derivative a) | Polymer Component B | Photoacid Generator C | Crosslinking Agent D | Compound E | Dispersion Resin F | Basic Compound | Surfactant |
|---|---|---|---|---|---|---|---|---|
| Example 19 | A-1 | B3-1 | C-1 | — | E-1 | — | 1 | 1 |
| Example 20 | A-1 | B1-1 | C-2 | — | — | — | 1 | 1 |
| Example 21 | A-13/A-14/A-15 | B1-1 | C-1 | — | — | — | 1 | 1 |
| Example 22 | A-16 (a-1) | B1-1 | C-1 | — | — | F-1 | 1 | 1 |

TABLE 2

|  | Infrared Shielding Agent A (Pigment Derivative a) | Polymer Component B | Photoacid Generator C | Crosslinking Agent D | Compound E | Dispersion Resin F | Basic Compound | Surfactant |
|---|---|---|---|---|---|---|---|---|
| Example 31 | A-16 (a-2) | B1-1 | C-1 | — | — | F-1 | 1 | 1 |
| Example 32 | A-17 (a-3) | B1-1 | C-1 | — | — | F-1 | 1 | 1 |
| Example 33 | A-17 (a-4) | B1-1 | C-1 | — | — | F-2 | 2 | 1 |
| Example 34 | A-18 | B1-1 | C-1 | — | — | — | 1 | 1 |
| Example 35 | A-19 | B1-1 | C-1 | — | — | — | 1 | 2 |
| Example 36 | A-20 | B1-1 | C-1 | — | — | — | 1 | 1 |
| Example 37 | A-21 | B1-1 | C-1 | — | — | — | 1 | 1 |
| Example 38 | A-22 | B1-1 | C-1 | — | — | — | 2 | 3 |
| Example 39 | A-23 | B1-1 | C-1 | — | — | — | 1 | 2 |
| Example 40 | A-24 | B1-1 | C-1 | — | — | — | 1 | 1 |
| Example 41 | A-25 | B1-1 | C-1 | — | — | — | 1 | 1 |
| Example 42 | A-26 | B1-1 | C-1 | — | — | — | 1 | 1 |
| Example 43 | A-1 | B1-1 | C-3 | — | — | — | 1 | 1 |
| Example 44 | A-1 | B1-1 | C-4 | — | — | — | 2 | 1 |
| Example 45 | A-1 | B2-1 | C-1 | D-2 | — | — | 1 | 1 |
| Example 46 | A-1 | B2-1 | C-1 | D-3 | — | — | 1 | 1 |
| Example 47 | A-1 | B2-1 | C-1 | D-4 | — | — | 1 | 1 |
| Example 48 | A-1 | B3-1 | C-1 | — | E-2 | — | 1 | 2 |
| Example 49 | A-6 | B1-2 | C-1 | — | — | — | 1 | 1 |
| Example 50 | A-10 | B1-3 | C-1 | — | — | — | 2 | 3 |
| Example 51 | A-11 | B1-4 | C-1 | — | — | — | 1 | 1 |
| Example 52 | A-12 | B1-1 | C-2 | — | — | — | 1 | 1 |
| Example 53 | A-16 (a-1) | B1-1 | C-3 | — | — | F-1 | 1 | 2 |
| Example 54 | A-16 (a-2) | B1-1 | C-4 | — | — | F-1 | 1 | 1 |
| Example 55 | A-17 (a-3) | B1-1 | C-1 | D-1 | — | F-1 | 1 | 1 |
| Example 56 | A-17 (a-4) | B1-1 | C-1 | D-2 | — | F-2 | 2 | 1 |
| Example 57 | A-18 | B1-1 | C-1 | — | E-1 | — | 1 | 1 |
| Example 58 | A-19 | B1-1 | C-1 | — | E-2 | — | 1 | 1 |
| Example 59 | A-20 | B1-1/B1-3 | C-1 | — | — | — | 1 | 1 |
| Example 60 | A-21 | B1-1/B3-1 | C-1 | — | — | — | 1 | 1 |
| Example 61 | A-22 | B1-1 | C-1/C-3 | — | — | — | 2 | 3 |
| Example 62 | A-23 | B1-1 | C-1 | D-1/D-2 | — | — | 1 | 1 |
| Example 63 | A-24 | B1-1 | C-1 | — | E-1/E-2 | — | 1 | 2 |
| Example 64 | A-25 | B1-1 | C-1 | D-1 | E-1 | — | 2 | 1 |
| Example 65 | A-26 | B1-1 | C-1 | D-1/D-3 | — | — | 1 | 1 |
| Example 66 | A-10/A-11 | B1-1 | C-1 | — | — | — | 1 | 1 |
| Example 67 | A-10/A-12 | B1-1 | C-1 | — | — | — | 1 | 1 |
| Example 68 | A-16 (a-1)/A-17 (a-3) | B1-1 | C-1 | — | — | F-1 | 1 | 1 |
| Example 69 | A-19/A-20 | B1-1 | C-1 | — | — | — | 2 | 1 |
| Example 70 | A-21/A-22 | B1-1 | C-1 | — | — | — | 1 | 3 |
| Comparative Example1 | A-1 | — | C-1 | D-1 | E-1 | — | 1 | 1 |

(Infrared Shielding Agent)

A-1: NK-5060 (manufactured by Hayashibara Co., Ltd., a cyanine compound, absorption maximum: 865 nm (film))

A-2: Excolor TX-EX 708K (manufactured by Nippon Shokubai Co., Ltd., a phthalocyanine compound, absorption maximum: 755 nm (film))

A-3: a phthalocyanine compound synthesized according to Example 1 described in the specification of JP5046515B (absorption maximum: 990 nm (film))

A-4: Lumogen IR765 (manufactured by BASF SE, a quaterrylene compound, absorption maximum: 705 nm(film))

A-5: a copper phosphate complex synthesized using a method described in paragraph "0263" of JP2014-139617A (a copper compound, absorption maximum: 868 nm (film))

A-6: a pyrrolopyrrole compound synthesized according to Synthesis Example 2 of JP2011-068731A (absorption maximum: 780 nm (film))

A-7: a compound (1) of JP1986-042585A (JP-S61-042585A) (a metal dithiol compound, absorption maximum: 908 nm (film))

A-8: bis{bis(trifluoromethanesulfone)imidate}N,N,N',N'-tetrakis(p-dibenzylaminophenyl)-p-phenylenediimmonium synthesized according to Example 3 of the specification of JP4168031B (a diiminium compound, absorption maximum; 1060 nm (film))

A-9: YMF-02 (manufactured by Sumitomo Metal Mining Co., Ltd., $CS_{0.33}WO_3$ as a cesium tungsten oxide compound (an 18.5 mass % dispersion, average dispersed particle size: 800 nm or less, absorption maximum: 1550 to 1650 nm (film))

A-10 to A-26: compounds A-10 to A-26 having the following structures (Pigment Derivative)

a-1 to a-4: compounds a-1 to a-4 having the following structures

A-10 was synthesized using a method described in WO2014/199937A. A-11 and A-12 were synthesized using a method described in WO2017/130825A. A-13, A-14, and A-15 were synthesized using a method described in JP2016-146619A. A-16, A-17, a-1, a-3, and a-4 were synthesized using a method described in WO2017/146092A. A-18 was synthesized using a method described in JP2016-074949A. A-19 was synthesized using a method described in JP2017-067963A. A-20 was synthesized using a method described in JP2017-082029A. A-21 was synthesized using a method described in JP2016-079331A. A-22 was synthesized using a method described in JP2017-141425A. A-23 was synthesized using a method described in JP2017-137264A. A-24 was synthesized using a method described in JP2011-208101A. A-25 was synthesized using a method described in JP2010-180308A. A-26 was synthesized using a method described in JP2017-197437A.

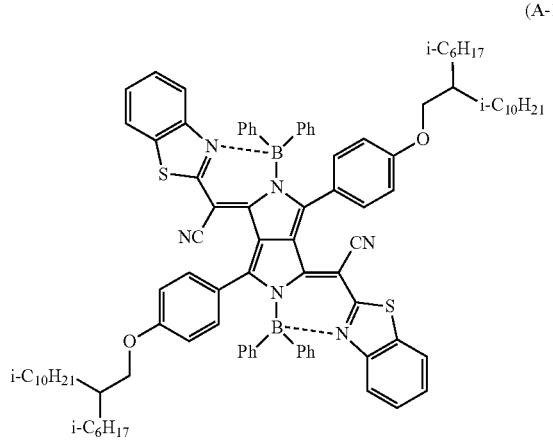
(A-10)

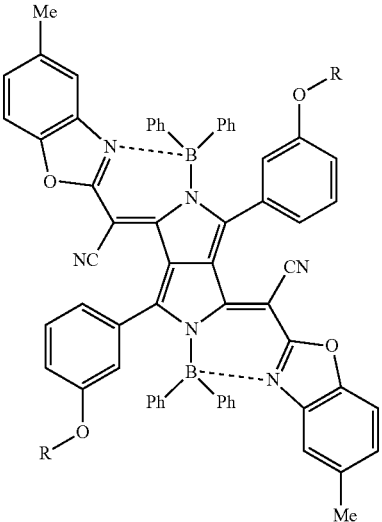
(A-11)

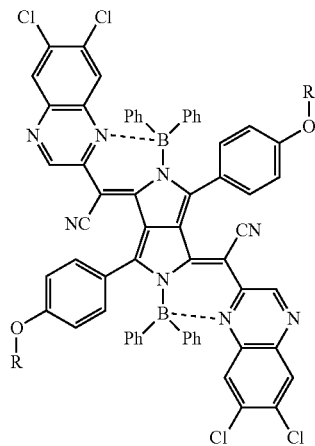
(A-12)

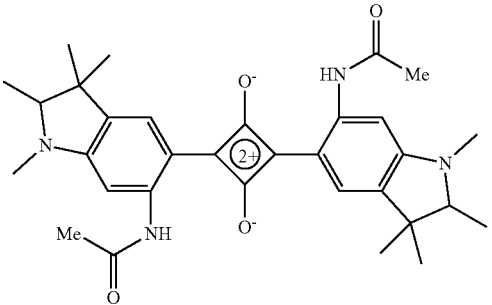
(A-13)

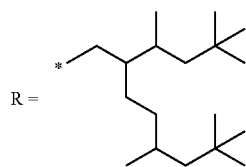
R =

(A-14)
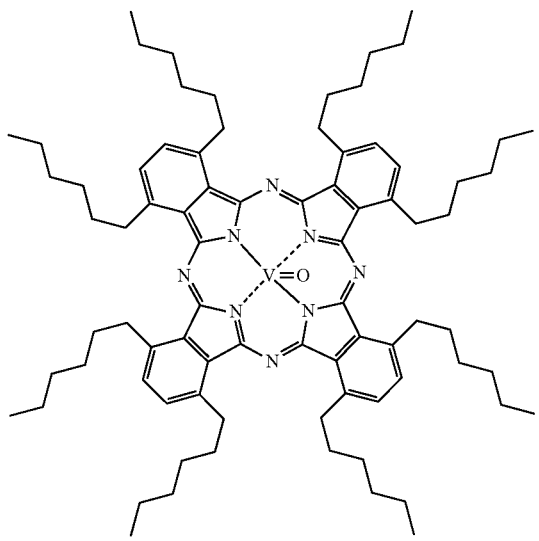
(A-15)
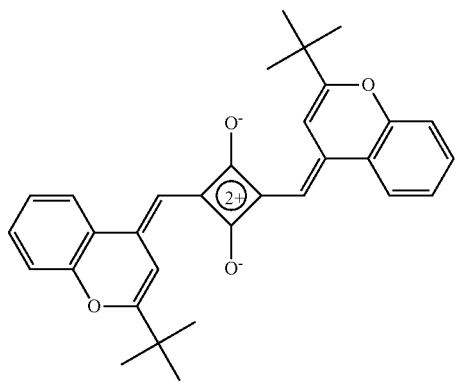
(A-16)
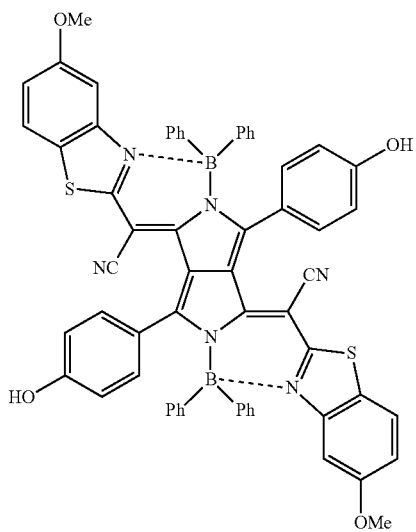
(A-17)
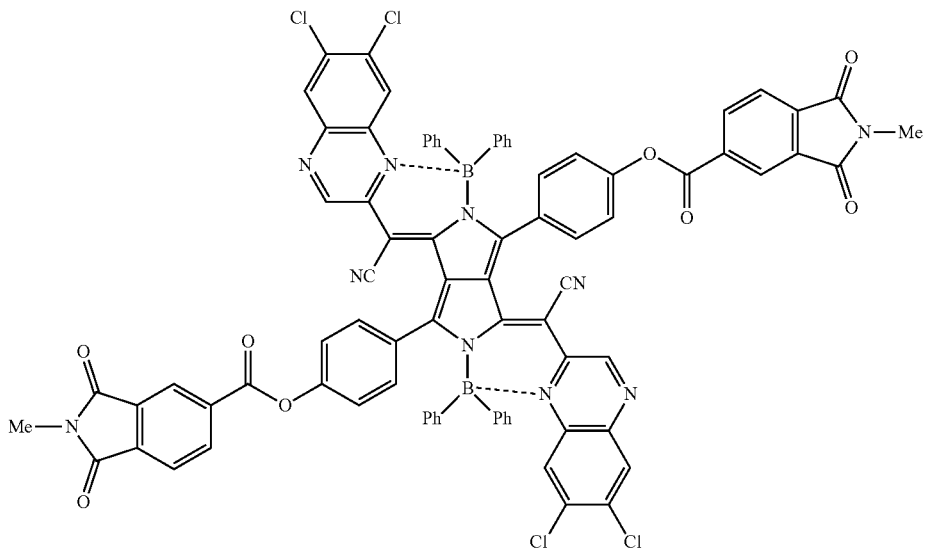

(A-18)
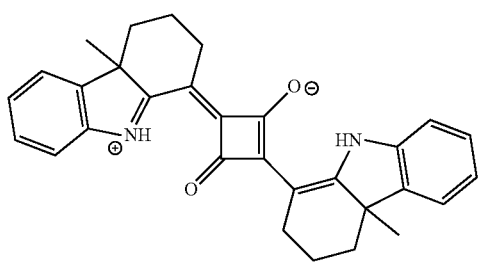
(A-19)
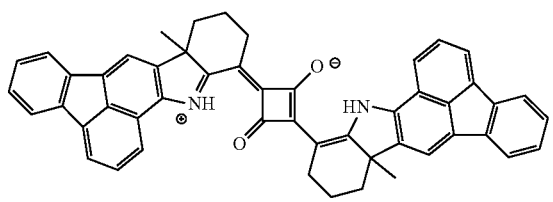
(A-20)
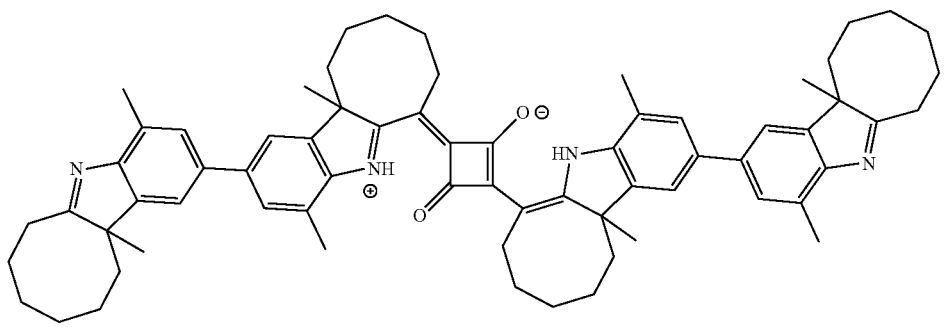
(A-21)
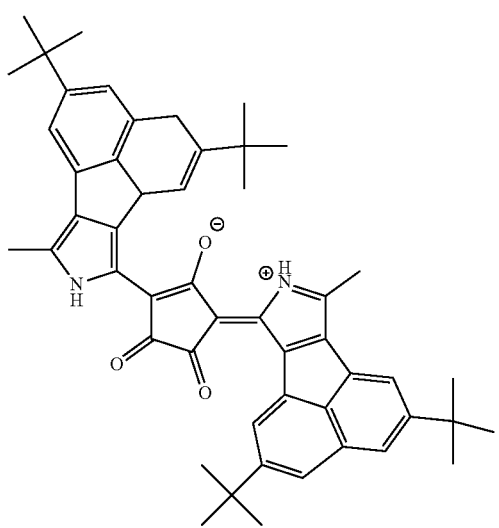
(A-22)
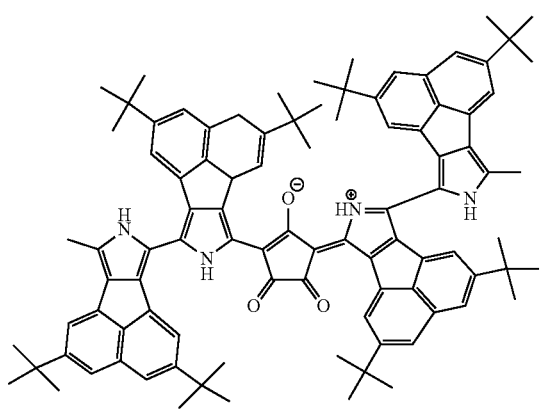

-continued
(A-23)
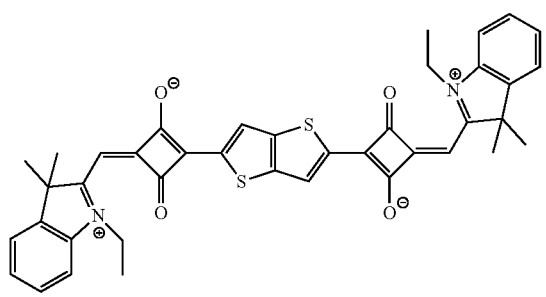
(A-24)
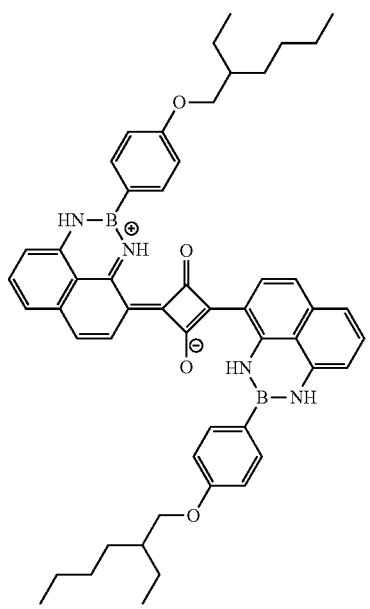
(A-25)
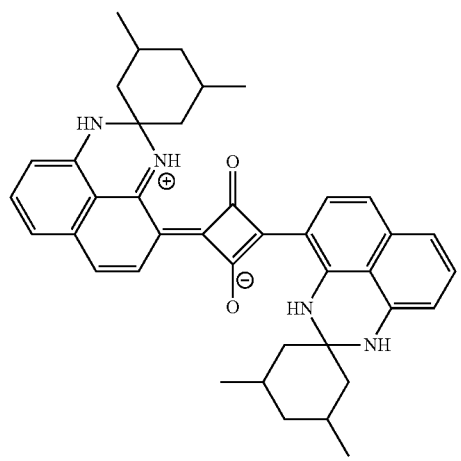
(A-26)
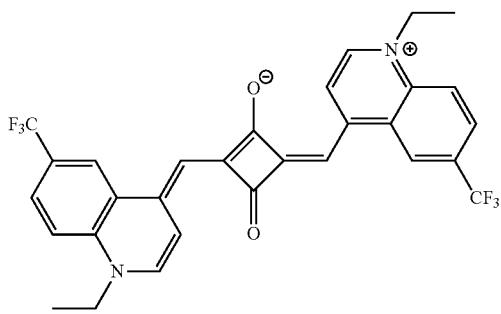
(a-1)
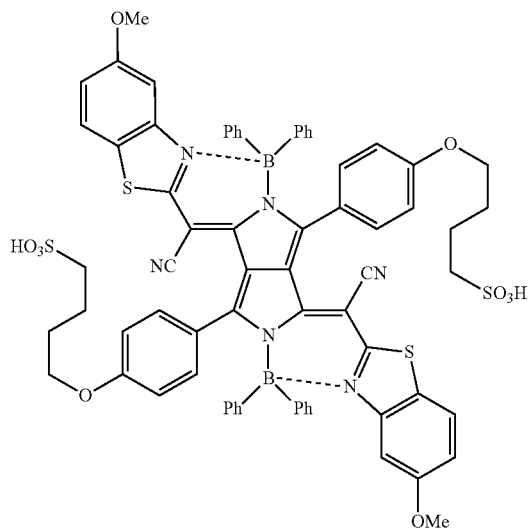
(a-2)
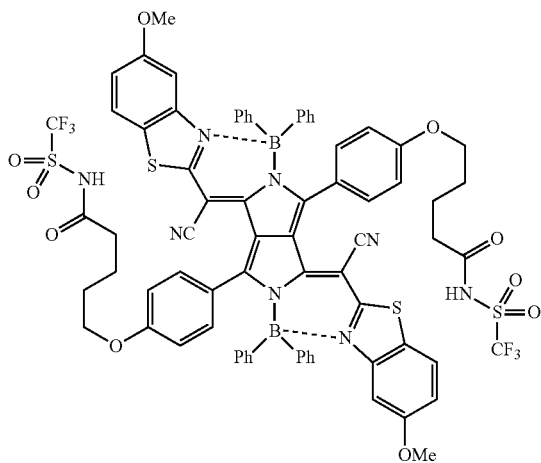

-continued (a-3)
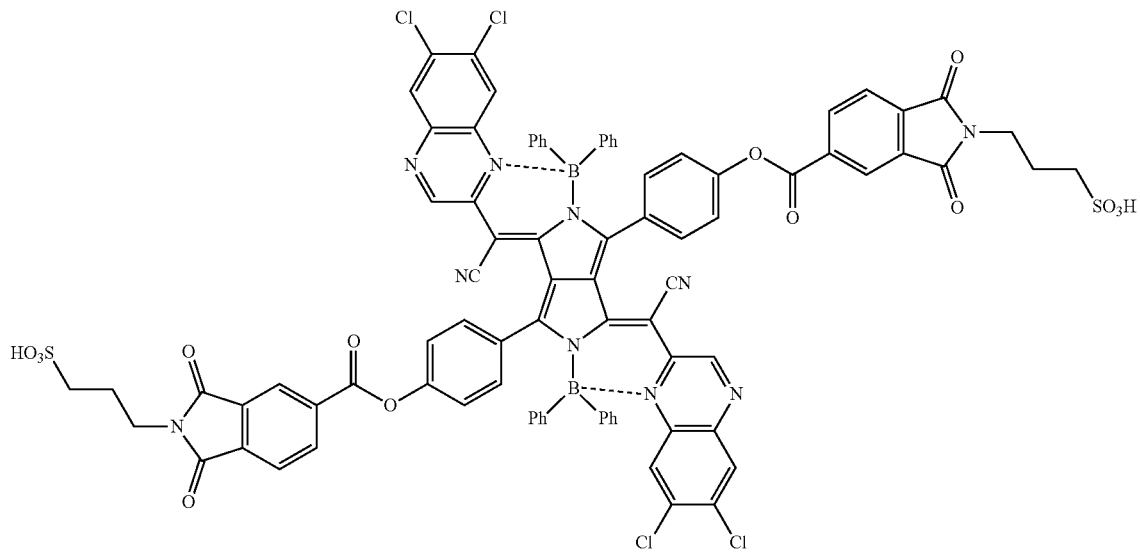

(a-4)
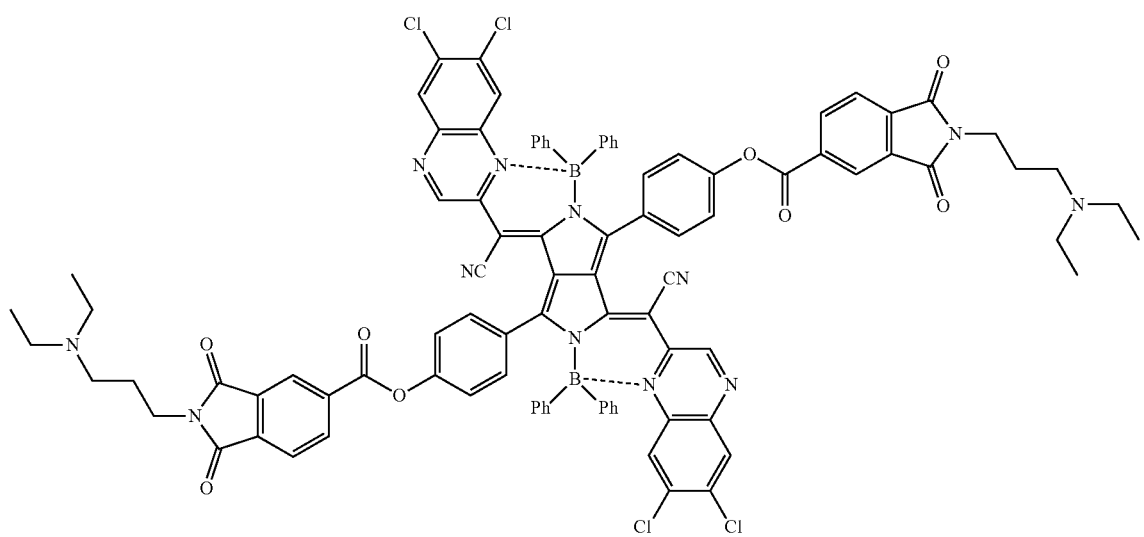

(Polymer Component)

Polymer B1-1: a polymer having the following structure (a numerical value added to a repeating unit represents a molar ratio; weight-average molecular weight: 15000)

Polymer B1-2: a polymer having the following structure (a numerical value added to a repeating unit represents a molar ratio; weight-average molecular weight: 15000)

Polymer B1-3: a polymer having the following structure (a numerical value added to a repeating unit represents a molar ratio; weight-average molecular weight: 15000)

Polymer B1-4: a polymer having the following structure (a numerical value added to a repeating unit represents a molar ratio; weight-average molecular weight: 19000)

Polymer B2-1: a polymer having the following structure (a numerical value added to a repeating unit represents a molar ratio; weight-average molecular weight: 15000)

Polymer B3-1: a polymer having the following structure (a numerical value added to a repeating unit represents a molar ratio; weight-average molecular weight: 15000)

(B1-1)
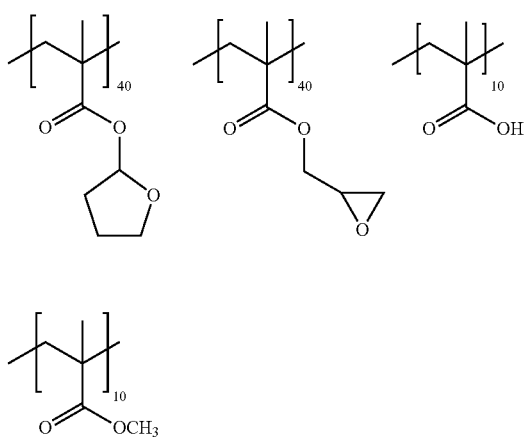

(B1-2)
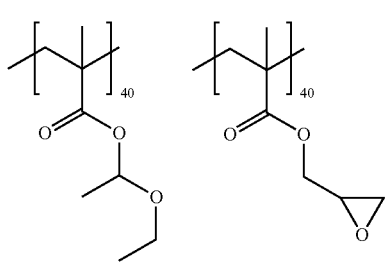
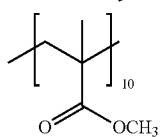
(B1-3)
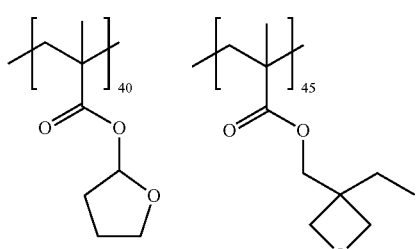
(B1-4)
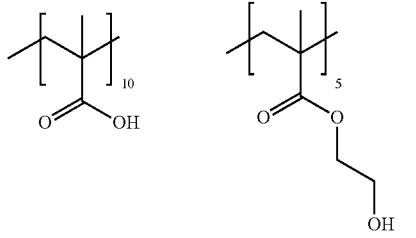
(B2-1)
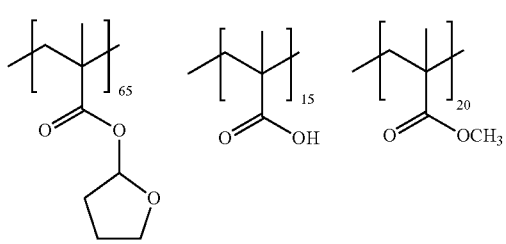
(B3-1)
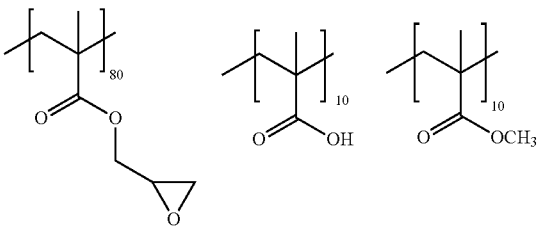
(Photoacid Generator)
C-1: a compound having the following structure (PAG-103, manufactured by BASF SE)
C-2: a compound having the following structure (GSID-26-1, manufactured by BASF SE, a triarylsulfonium salt)
C-3: a compound having the following structure
C-4: a compound having the following structure
(C-1)
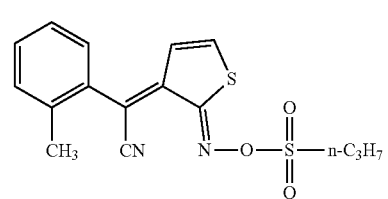
(C-2)
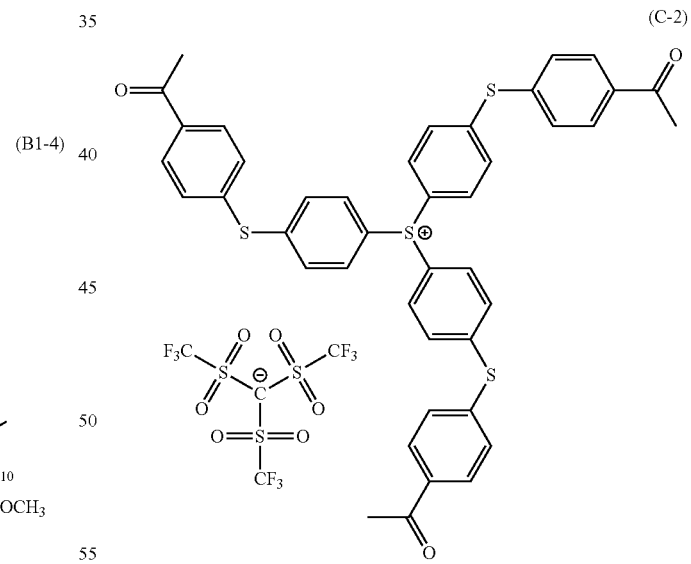
(C-3)
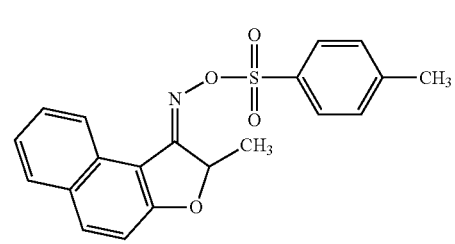

-continued (C-4)

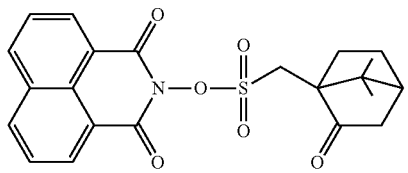

(Crosslinking Agent)

D-1: a compound having the following structure (JER YX4000HK, manufactured by Mitsubishi Chemical Corporation, a biphenyl type bifunctional epoxy, molecular weight: 354)

D-2: a compound having the following structure (JER 1031S, manufactured by Mitsubishi Chemical Corporation, a tetrafunctional epoxy, molecular weight: 623)

D-3: a compound having the following structure (a bifunctional oxetane, molecular weight: 364)

D-4: a compound having the following structure (a bifunctional oxetane, molecular weight: 334)

(D-1)

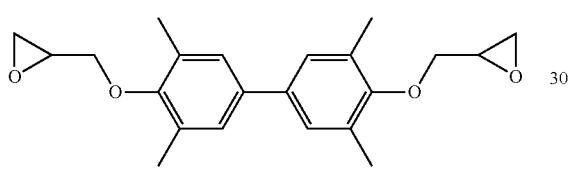

(D-2)

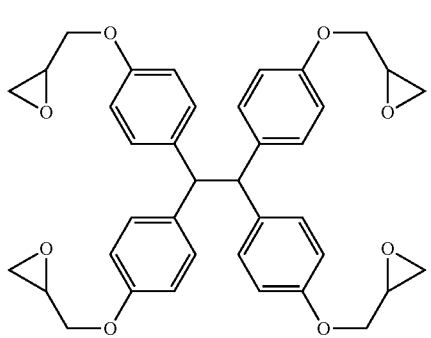

(D-3)

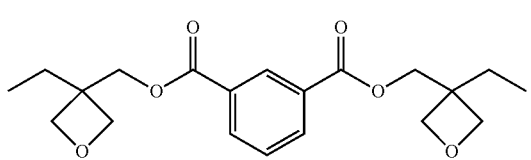

-continued (D-4)

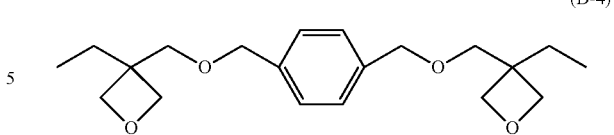

(Compound E)

E-1: a compound having the following structure (a phenolic hydroxyl group of 9,9-bis(hydroxyphenyl)fluorene (manufactured by JFE Chemical Corporation) is protected by ethyl vinyl ether using an ordinary method, molecular weight: 494)

E-2: a compound having the following structure (molecular weight: 731)

(E-1)

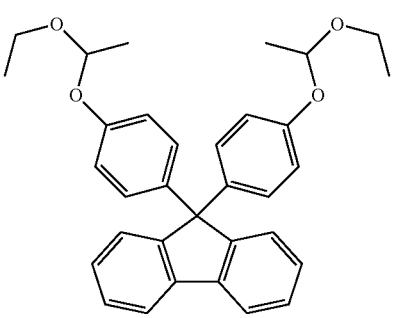 [SMILES: CCOC(C)Oc1ccc(C2(c3ccc(OC(C)OCC)cc3)c3ccccc3-c3ccccc32)cc1]

(E-2)

(Dispersion Resin)

F-1: a dispersion resin having the following structure (a numerical value added to a main chain represents a molar ratio, and a numerical value added to a side chain represents the number of repeating units; Mw=22900)

F-2: a dispersion resin having the following structure (a numerical value added to a main chain represents a molar ratio, and a numerical value added to a side chain represents the number of repeating units; Mw=38900)

(F-1)

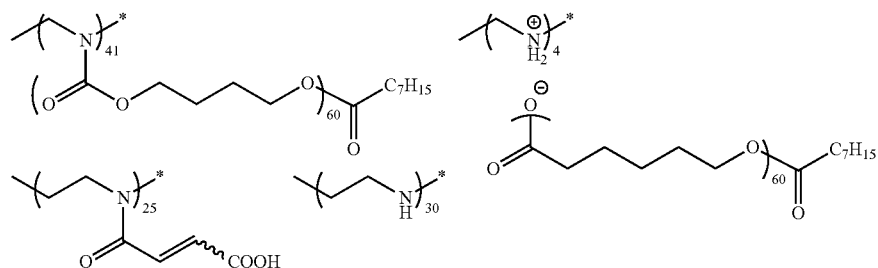

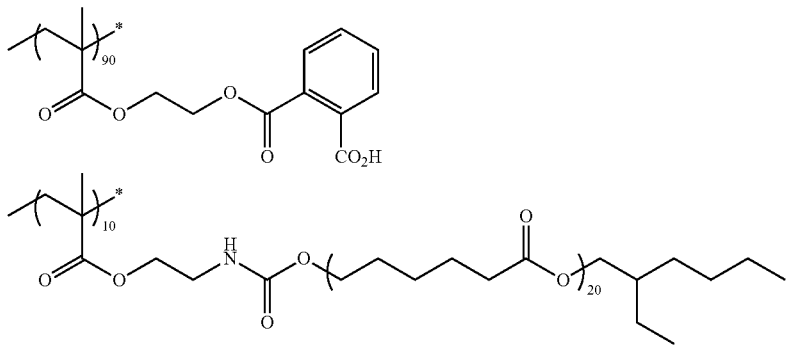

Surfactant 1: a silicone surfactant (manufactured by Dow Corning Corporation, SH8400 FLUID)
Surfactant 2: a fluorine surfactant (manufactured by Neos Co., Ltd., FTERGENT FTX-218)
Surfactant 3: a perfluoroalkyl group-containing nonionic surfactant (manufactured by DIC Corporation, F-554)
Basic compound 1: 1,8-diazabicyclo[5.4.0]-7-undecene
Basic compound 2: a compound having the following structure

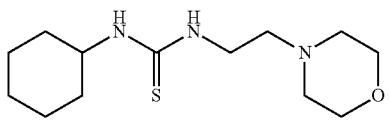 [SMILES: S=C(NCCN1CCOCC1)NC1CCCCC1]

<Evaluation>
The following raw materials were mixed with each other to prepare a composition for forming an undercoat layer.

| | |
|---|---|
| PGMEA | 19.20 parts by mass |
| Ethyl Lactate | 36.67 parts by mass |
| Resin: (a 41% ethyl acetate solution of a copolymer including benzyl methacrylate, methacrylic acid, and 2-hydroxyethyl methacrylate (molar ratio = 60:20:20)) | 30.51 parts by mass |
| Dipentaerythritol hexaacrylate | 12.20 parts by mass |
| Polymerization inhibitor (p-methoxyphenol) | 0.006 parts by mass |
| Surfactant (the following mixture) | 0.83 parts by mass |

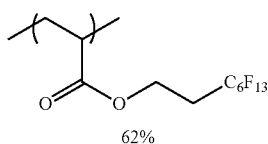

62%

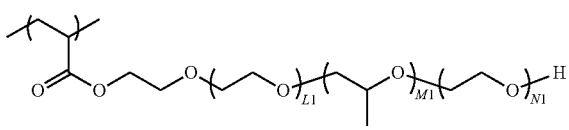

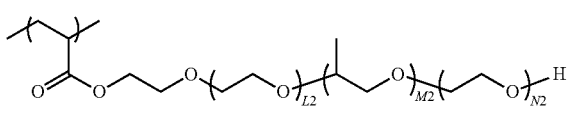

L1 + N1 = L2 + N2 = 14
M1 = M2 = 17

38%

| | |
|---|---|
| Photopolymerization Initiator (TAZ-107, manufactured by Midori Kagaku Co., Ltd.) | 0.59 parts by mass |

Preparation of Glass Wafer with Undercoat Layer

The composition for forming an undercoat layer was applied to an 8 inch (=203.2 mm) glass wafer using a spin coater to form a coating film. Next, the formed coating film was heated using a hot plate at 120° C. for 120 seconds. The rotation speed of the spin coater was adjusted such that the thickness of the heated coating film was about 0.5 μm. The heated coating film was further treated in an oven at 220° C. for 1 hour to cure the coating film. As a result, an undercoat layer was formed. This way, the glass wafer with the undercoat layer in which the undercoat layer was formed on the glass wafer was obtained.

(Evaluation of Near Infrared Shielding Properties (Infrared Shielding Properties))

Each of the photosensitive compositions was applied to the glass wafer with the undercoat layer using a spin coater such that the thickness of the dried coating film was 1.0 μm. Next, the coating film was heated using a hot plate at 100° C. for 2 minutes and at 200° C. for 5 minutes. As a result, a cured film was formed. Regarding the prepared cured film, an absorbance at an incidence angle of 0° at an absorption maximum was measured using a spectrophotometer U4100 (manufactured by Hitachi High-Technologies Corporation). The evaluation standards are as follows.

A: a minimum transmittance in 650 to 1200 nm was lower than 5%
B: a minimum transmittance in 650 to 1200 nm was higher than 5% and lower than 10%
C: a minimum transmittance in 650 to 1200 nm was higher than 10% and lower than 20%
D: a minimum transmittance in 650 to 1200 nm was 20% or higher (Heat Resistance)

The cured film used for the evaluation of the near infrared shielding properties was heated using a hot plate at 265° C. for 5 minutes to perform a heat-resistance test. A transmittance of the cured film in a wavelength range of 400 to 1200 nm was measured before and after the heat-resistance test to calculate a change in transmittance at each wavelength from the following expression. Using a maximum value of the change in transmittance in a wavelength range of 400 to 1200 nm, heat resistance was evaluated based on the following standards.

Change in Transmittance=[Transmittance before Heat-Resistance Test−Transmittance after Heat-Resistance Test]

A: the maximum value of the change in transmittance was lower than 3%

B: the maximum value of the change in transmittance was higher than 3% and lower than 5%

C: the maximum value of the change in transmittance was higher than 5% and lower than 10%

D: the maximum value of the change in transmittance was higher than 10%

(Pattern Formability)

Each of the photosensitive compositions was applied to the glass wafer with the undercoat layer using a spin coater such that the thickness of the dried coating film was 1.0 µm. Next, the coating film was heated using a hot plate at 100° C. for 2 minutes. Next, using an i-ray stepper exposure device FPA-3000 i5+(manufactured by Canon Corporation) at 1000 mJ/cm², the coating film was exposed to a 2 µm Bayer pattern through a mask at an exposure dose of 1000 mJ/cm². Next, puddle development was performed at 23° C. for 60 seconds using a tetramethylammonium hydroxide (TMAH) 0.3 mass % aqueous solution. Next, the coating film was rinsed by spin showering, was cleaned with pure water, and was heated using a hot plate at 230° C. for 5 minutes. As a result, a pattern was formed.

The obtained pattern was observed using a scanning electron microscope (SEM), and pattern formability was evaluated based on the following standards.

A: no residues were observed between patterns.

B: a small amount of residues were observed between patterns

C: a large amount of residues were observed between patterns

D: No patterns were able to be performed

TABLE 3

| | Evaluation Result | | |
|---|---|---|---|
| | Infrared Shielding Properties | Heat Resistance | Pattern Formability |
| Example 1 | A | C | A |
| Example 2 | A | B | A |
| Example 3 | A | B | A |
| Example 4 | A | B | A |
| Example 5 | C | C | A |
| Example 6 | A | A | A |
| Example 7 | B | C | A |
| Example 8 | B | C | A |
| Example 9 | C | C | A |
| Example 10 | A | A | A |
| Example 11 | A | A | A |
| Example 12 | A | A | A |
| Example 13 | A | B | A |
| Example 14 | A | C | A |
| Example 15 | A | C | A |
| Example 16 | A | C | A |
| Example 17 | A | C | B |
| Example 18 | A | C | C |
| Example 19 | A | C | C |
| Example 20 | A | C | B |
| Example 21 | A | B | A |
| Example 22 | A | A | A |

TABLE 4

| | Evaluation Result | | |
|---|---|---|---|
| | Infrared Shielding Properties | Heat Resistance | Pattern Formability |
| Example 31 | A | A | A |
| Example 32 | A | A | A |
| Example 33 | A | A | A |
| Example 34 | A | B | A |
| Example 35 | A | B | A |
| Example 36 | A | B | A |
| Example 37 | A | B | A |
| Example 38 | A | B | A |
| Example 39 | A | B | A |
| Example 40 | A | B | A |
| Example 41 | A | B | A |
| Example 42 | A | B | A |
| Example 43 | A | C | A |
| Example 44 | A | C | B |
| Example 45 | A | C | C |
| Example 46 | A | C | C |
| Example 47 | A | C | C |
| Example 48 | A | C | C |
| Example 49 | A | A | A |
| Example 50 | A | A | A |
| Example 51 | A | A | A |
| Example 52 | A | A | B |
| Example 53 | A | A | A |
| Example 54 | A | A | B |
| Example 55 | A | A | C |
| Example 56 | A | A | C |
| Example 57 | A | B | C |
| Example 58 | A | B | C |
| Example 59 | A | B | A |
| Example 60 | A | B | A |
| Example 61 | A | B | A |
| Example 62 | A | B | C |
| Example 63 | A | B | C |
| Example 64 | A | B | A |
| Example 65 | A | B | A |
| Example 66 | A | A | A |
| Example 67 | A | A | A |
| Example 68 | A | A | A |
| Example 69 | A | B | A |
| Example 70 | A | B | A |
| Comparative Example 1 | A | D | D |

As shown in the above tables, in Examples, heat resistance and pattern formability were excellent. The same effects as those of each of Examples were obtained even in a case where two or more kinds of the photoacid generators, the crosslinking agents, the compounds E, and the dispersion resins F were used in combination. In addition, the same effects as those of each of Examples were obtained even in a case where a compound (D-3) or (D-4) as the crosslinking agent was further added to the photosensitive composition according to each of Examples.

Test Example 2

Preparation of Photosensitive Composition

Example 101

The following components were mixed and stirred, and the obtained mixture was filtered through a nylon filter (manufactured by Pall Corporation) having a pore size of 0.45 µm to prepare a photosensitive composition according to Example 101.

Photosensitive composition according to Example 1 . . . 22.67 parts by mass

Pigment Dispersion 101 . . . 51.23 parts by mass (Pigment Dispersion 101)

60 parts by mass of C.I. Pigment Black 32, 20 parts by mass of C.I. Pigment Blue 15:6, 20 parts by mass of C.I. Pigment Yellow 139, 80 parts by mass (solid content concentration: 50 mass %) of SOLSPERSE 76500 (manufactured by Lubrication Technology Inc., solid content concentration: 50 mass %), 120 parts by mass (solid content concentration: 35 mass %) of a solution including the following alkali-soluble resin (E-1), and 700 parts by mass of propylene glycol monomethyl ether acetate were mixed with each other, and the obtained mixture was dispersed using a paint shaker for 8 hours. As a result, a pigment dispersion 101 was obtained.

(Solution Including Alkali-Soluble Resin (E-1))

In a reaction vessel, 14 g of benzyl methacrylate, 12 g of N-phenylmaleimide, 15 g of 2-hydroxyethyl methacrylate, 10 g of styrene, and 20 g of methacrylic acid were dissolved in 200 g of propylene glycol monomethyl ether acetate, and 3 g of 2,2'-azoisobutyronitrile and 5 g of α-methylstyrene dimer were further put thereinto. After nitrogen purge, the inside of the reaction vessel was heated at 80° C. for 5 hours under stirring and nitrogen bubbling. As a result, a solution including an alkali-soluble resin (E-1) (solid content concentration: 35 mass %) was obtained. In the alkali-soluble resin (E-1), the weight-average molecular weight (Mw) was 9700, the number-average molecular weight (Mn) was 5700, and Mw/Mn was 1.70.

The same effects as those of Example 1 were obtained in a case where the same evaluation as that of Test Example 1 was performed using the photosensitive composition according to Example 101. In addition, the cured film obtained using the photosensitive composition according to Example 101 was able to shield light in a visible range and to allow transmission of at least a part of light (near infrared light) in a near infrared range.

Test Example 3

The photosensitive composition according to Example 12 was applied to a silicon wafer using a spin coating method such that the thickness of the formed film was 1.0 μm. Next, the coating film was heated using a hot plate at 100° C. for 2 minutes. Next, the coating film was heated using a hot plate at 230° C. for 5 minutes. Next, a 2 μm Bayer pattern (near infrared cut filter) was formed using a dry etching method.

Next, a Red composition was applied to the Bayer pattern of the near infrared cut filter using a spin coating method such that the thickness of the formed film was 1.0 μm. Next, the coating film was heated using a hot plate at 100° C. for 2 minutes. Next, using an i-ray stepper exposure device FPA-3000 i5+(manufactured by Canon Corporation), the coating film was exposed to a 2 μm dot pattern through a mask at an exposure dose of 1000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the Red composition was patterned on the Bayer pattern of the near infrared cut filter. Likewise, a Green composition and a Blue composition were sequentially patterned to form red, blue, and green color patterns.

Next, the photosensitive composition according to Example 101 was applied to the pattern-formed film using a spin coating method such that the thickness of the formed film was 2.0 μm. Next, the coating film was heated using a hot plate at 100° C. for 2 minutes. Next, using an i-ray stepper exposure device FPA-3000 i5+(manufactured by Canon Corporation) at 1000 mJ/cm², the coating film was exposed to a 2 μm Bayer pattern through a mask at 1000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 230° C. for 5 minutes. As a result, the infrared transmitting filter was patterned on a portion where the Bayer pattern of the near infrared cut filter was not formed. This filter was incorporated into a solid image pickup element using a well-known method The obtained solid image pickup element was irradiated with light emitted from a 940 nm infrared light emitting diode (infrared LED) as a light source in a low-illuminance environment (0.001 Lux) to acquire images. Next, the imaging performance of the solid image pickup element was evaluated. The subject was able to be clearly recognized on the image. In addition, incidence angle dependence was good.

The same effects were obtained even in a case where the pattern formation of the near infrared cut filter using the photosensitive composition according to Example 12 was performed using a photolithography method.

The Red composition, the Green composition, and the Blue composition used in Test Example 3 are as follows.

(Red Composition)

The following components were mixed and stirred, and the obtained mixture was filtered through a nylon filter (manufactured by Pall Corporation) having a pore size of 0.45 μm to prepare a Red composition.

| | |
|---|---|
| Red Pigment Dispersion | . . . 51.7 parts by mass |
| Resin 204 (40 mass % PGMEA solution) | . . . 0.6 parts by mass |
| Polymerizable Compound 204 | . . . 0.6 parts by mass |
| Photopolymerization initiator (IRGACURE-OXE01, manufactured by BASF SE) | . . . 0.3 parts by mass |
| Surfactant 201 | . . . 4.2 parts by mass |
| PGMEA (propylene glycol monomethyl ether acetate) | . . . 42.6 parts by mass |

(Green Composition)

The following components were mixed and stirred, and the obtained mixture was filtered through a nylon filter (manufactured by Pall Corporation) having a pore size of 0.45 μm to prepare a Green composition.

| | |
|---|---|
| Green Pigment Dispersion | ... 73.7 parts by mass |
| Resin 204 (40 mass % PGMEA solution) | ... 0.3 parts by mass |
| Polymerizable Compound 201 | ... 1.2 parts by mass |
| Photopolymerization initiator (IRGACURE-OXE01, manufactured by BASF SE) | ... 0.6 parts by mass |
| Surfactant 201 | ... 4.2 parts by mass |
| Ultraviolet absorber (UV-503, manufactured by Daito Chemical Co., Ltd.) | ... 0.5 parts by mass |
| PGMEA | ... 19.5 parts by mass |

(Blue Composition)

The following components were mixed and stirred, and the obtained mixture was filtered through a nylon filter (manufactured by Pall Corporation) having a pore size of 0.45 μm to prepare a Blue composition.

| | |
|---|---|
| Blue Pigment Dispersion | ... 44.9 parts by mass |
| Resin 204 (40 mass % PGMEA solution) | ... 2.1 parts by mass |
| Polymerizable Compound 201 | ... 1.5 parts by mass |
| Polymerizable Compound 204 | ... 0.7 parts by mass |
| Photopolymerization initiator 201 (IRGACURE-OXE01, manufactured by BASF SE) | ... 0.8 parts by mass |
| Surfactant 201 | ... 4.2 parts by mass |
| PGMEA | ... 45.8 parts by mass |

Raw materials used in the Red composition, the Green composition, the Blue composition, and the composition for forming an infrared transmitting filter are as follows.

Red Pigment Dispersion 9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (Disperbyk-161, manufactured by BYK Chemie), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Blue pigment dispersion was obtained.

Polymerizable compound 201: KAYARAD DPHA (manufactured by Nippon Kayaku Co., Ltd.)

Polymerizable compound 204: a compound having the following structure

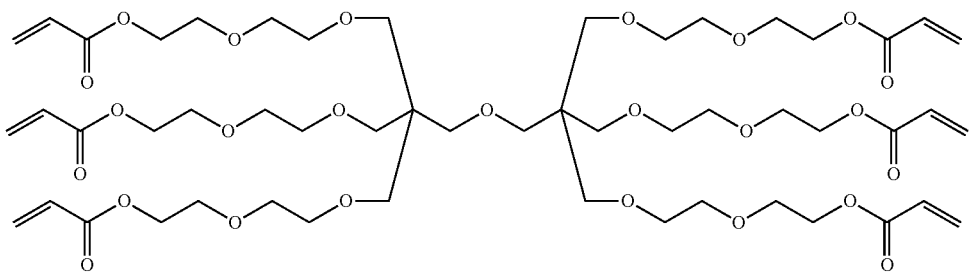 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Resin 204: a resin having the following structure (acid value: 70 mgKOH/g, Mw=11000, a numerical value added to a main chain represents a molar ratio)

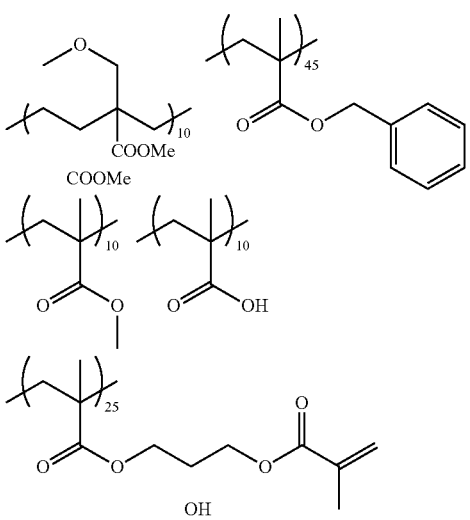

Surfactant 201: a 1 mass % PGMEA solution of the following mixture (Mw: 14000; in the following formula, "%" representing the proportion of a repeating unit is mass %)

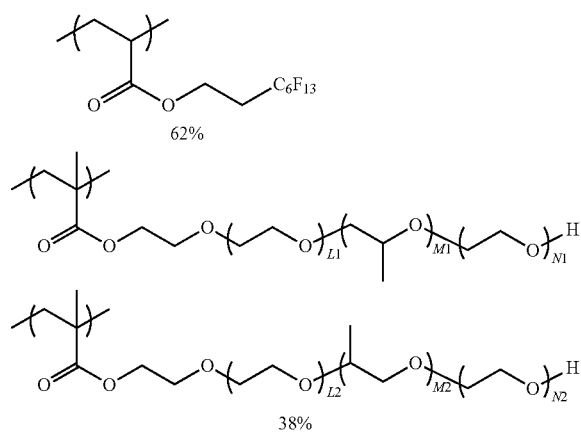

L1 + N1 = L2 + N2 = 14
M1 = M2 = 17

EXPLANATION OF REFERENCES

110: solid image pickup element
111: near infrared cut filter
112: color filter
114: infrared transmitting filter
115: microlens
116: planarizing layer

What is claimed is:

1. A photosensitive composition comprising an infrared shielding agent A, a polymer component B, a photoacid generator C, and a coloring material that allows transmission of infrared light and shields visible light,
   wherein the infrared shielding agent A is at least one selected from the group consisting of a diiminium compound, a squarylium compound, a cyanine compound, a phthalocyanine compound, a naphthalocyanine compound, a quaterrylene compound, an aminium compound, an iminium compound, an azo compound, an anthraquinone compound, a porphyrin compound, a pyrrolopyrrole compound, an oxonol compound, a croconium compound, a hexaphyrin compound, a metal dithiol compound, a copper compound, a tungsten compound, and a metal boride,
   wherein at least one of the following requirement (1), (2), (3) or (4) is satisfied,
   (1) the polymer component B includes a polymer B1 that includes a repeating unit b1 having a group in which at least one group selected from an acid group or a hydroxyl group is protected by an acid-decomposable group and a repeating unit b2 having a crosslinking group,
   (2) the polymer component B includes a polymer B2 including the repeating unit b1 and a polymer B3 including the repeating unit b2,
   (3) the polymer component B includes the polymer B2 and the photosensitive composition further comprises a compound having a molecular weight of 1000 or lower that has a crosslinking group, and
   (4) the polymer component B includes the polymer B3 and the photosensitive composition further comprises a compound having a molecular weight of 1000 or lower that has a group in which at least one group selected from an acid group or a hydroxyl group is protected by an acid-decomposable group.

2. The photosensitive composition according to claim 1, wherein the acid-decomposable group is any one of groups represented by following Formulae (Y1) to (Y4), $$—C(R^{31})(R^{32})(R^{33}), \quad \text{Formula (Y1):}$$

$$—C(=O)OC(R^{31})(R^{32})(R^{33}), \quad \text{Formula (Y2):}$$

$$—C(R^{36})(R^{37})(OR^{38}), \quad \text{Formula (Y3):}$$

$$—C(Rn)(H)(Ar), \quad \text{Formula (Y4):}$$

in Formulae (Y1) and (Y2), $R^{31}$ to $R^{33}$ each independently represent an alkyl group and two of $R^{31}$ to $R^{33}$ may be bonded to each other to form a ring,
in Formula (Y3), $R^{36}$ and $R^{37}$ each independently represent a hydrogen atom, an alkyl group, or an aryl group, at least one of $R^{36}$ or $R^{37}$ represents an alkyl group or an aryl group, $R^{38}$ represents an alkyl group or an aryl group, and $R^{36}$ or $R^{37}$ may be bonded to $R^{38}$ to form a ring, and
in Formula (Y4), Ar represents an aromatic ring group, Rn represents an alkyl group or an aryl group, and Rn and Ar may be bonded to each other to form a ring.

3. The photosensitive composition according to claim 2, wherein the crosslinking group is at least one selected from an epoxy group, an oxetanyl group, a methylol group, or an alkoxymethylol group, a blocked isocyanate group, and an ethylenically unsaturated bond group.

4. The photosensitive composition according to claim 2, further comprising the polymer B1.

5. The photosensitive composition according to claim 1, wherein the crosslinking group is at least one selected from an epoxy group, an oxetanyl group, a methylol group, an alkoxymethylol group, a blocked isocyanate group, and an ethylenically unsaturated bond group.

6. The photosensitive composition according to claim 5, further comprising the polymer B1.

7. The photosensitive composition according to claim 1, further comprising the polymer B1.

8. The photosensitive composition according to claim 1, wherein the photoacid generator C is an oxime sulfonate compound.

9. The photosensitive composition according to claim 1, which is a positive photosensitive composition.

10. A cured film which is formed using the photosensitive composition according to claim 1.

11. An optical filter comprising:
the cured film according to claim 10.

12. The optical filter according to claim 11, wherein the optical filter is a near infrared cut filter or an infrared transmitting filter.

13. A solid image pickup element comprising:
the cured film according to claim 10.

14. An image display device comprising:
the cured film according to claim 10.

15. An infrared sensor comprising:
the cured film according to claim 10.

16. The photosensitive composition according to claim 1, which is used as a near infrared cut filter or an infrared transmitting filter.

17. A photosensitive composition comprising an infrared shielding agent A, a polymer component B, and a photoacid generator C,
wherein the infrared shielding agent A is at least one selected from the group consisting of a diiminium compound, a squarylium compound, a cyanine compound, a phthalocyanine compound, a naphthalocyanine compound, a quaterrylene compound, an aminium compound, an iminium compound, an azo compound, an anthraquinone compound, a porphyrin compound, a pyrrolopyrrole compound, an oxonol compound, a croconium compound, a hexaphyrin compound, a metal dithiol compound, a copper compound, a tungsten compound, and a metal boride,
wherein at least one of the following requirement (1), (2), (3) or (4) is satisfied,
(1): the polymer component B includes a polymer B1 that includes a repeating unit b1 having a group in which at least one group selected from an acid group or a hydroxyl group is protected by an acid-decomposable group and a repeating unit b2 having a crosslinking group,
(2): the polymer component B includes a polymer B2 including the repeating unit b1 and a polymer B3 including the repeating unit b2,
(3): the polymer component B includes the polymer B2 and the photosensitive composition further comprises a compound having a molecular weight of 1000 or lower that has a crosslinking group, and
(4): the polymer component B includes the polymer B3 and the photosensitive composition further comprises a compound having a molecular weight of 1000 or lower that has a group in which at least one group selected from an acid group or a hydroxyl group is protected by an acid-decomposable group,
wherein the crosslinking group of the requirement (1) is located in the side chain of the polymer B1, and
wherein the compound having a molecular weight of 1000 or lower that has a crosslinking group of the requirement (3) is a compound having one or more groups of at least one kind selected from an epoxy group, an oxetanyl group, a methylol group, an alkoxymethylol group, a blocked isocyanate group, and an ethylenically unsaturated bond group.

18. The photosensitive composition according to claim 17,
wherein the compound having a molecular weight of 1000 or lower that has a crosslinking group of the requirement (3) is a compound having one or more groups of at least one kind selected from an epoxy group, an oxetanyl group, a methylol group, and an alkoxymethylol group.

19. The photosensitive composition according to claim 18,
wherein the infrared shielding agent A is at least one selected from the group consisting of a diiminium compound, a naphthalocyanine compound, a quaterrylene compound, an aminium compound, an iminium compound, a porphyrin compound, a pyrrolopyrrole compound, an oxonol compound, a croconium compound, a hexaphyrin compound, a copper compound, a tungsten compound, and a metal boride.

20. The photosensitive composition according to claim 18,
wherein the infrared shielding agent A is a pyrrolopyrrole compound.

21. The photosensitive composition according to claim 18,
which is used as a near infrared cut filter or an infrared transmitting filter.

22. The photosensitive composition according to claim 17,
wherein the infrared shielding agent A is at least one selected from the group consisting of a diiminium compound, a naphthalocyanine compound, a quaterrylene compound, an aminium compound, an iminium compound, a porphyrin compound, a pyrrolopyrrole compound, an oxonol compound, a croconium compound, a hexaphyrin compound, a copper compound, a tungsten compound, and a metal boride.

23. The photosensitive composition according to claim 17,
wherein the infrared shielding agent A is a pyrrolopyrrole compound.

24. The photosensitive composition according to claim 17,
which is used as a near infrared cut filter or an infrared transmitting filter.

25. A photosensitive composition comprising an infrared shielding agent A, a polymer component B, and a photoacid generator C,
wherein the infrared shielding agent A is at least one selected from the group consisting of a diiminium compound, a squarylium compound, a cyanine compound, a phthalocyanine compound, a naphthalocyanine compound, a quaterrylene compound, an aminium compound, an iminium compound, an azo compound, an anthraquinone compound, a porphyrin compound, a pyrrolopyrrole compound, an oxonol compound, a croconium compound, a hexaphyrin compound, a metal dithiol compound, a copper compound, a tungsten compound, and a metal boride,
wherein at least one of the following requirement (1), (2), (3) or (4) is satisfied,
(1): the polymer component B includes a polymer B1 that includes a repeating unit b1 having a group in which at least one group selected from an acid group or a hydroxyl group is protected by an acid-decomposable group and a repeating unit b2 having a crosslinking group,
(2): the polymer component B includes a polymer B2 including the repeating unit b1 and a polymer B3 including the repeating unit b2, (3): the polymer component B includes the polymer B2 and the photosensitive composition further comprises a compound having a molecular weight of 1000 or lower that has a crosslinking group, and (4): the polymer component B includes the polymer B3 and the photosensitive composition further comprises a compound having a molecular weight of 1000 or lower that has a group in which at least one group selected from an acid group or a hydroxyl group is protected by an acid-decomposable group, and wherein the photosensitive composition is a positive photosensitive composition.

26. The photosensitive composition according to claim 25, wherein the infrared shielding agent A is at least one selected from the group consisting of a diiminium compound, a naphthalocyanine compound, a quaterrylene compound, an aminium compound, an iminium compound, a porphyrin compound, a pyrrolopyrrole compound, an oxonol compound, a croconium compound, a hexaphyrin compound, a copper compound, a tungsten compound, and a metal boride.

27. The photosensitive composition according to claim 25, wherein the infrared shielding agent A is a pyrrolopyrrole compound.

28. The photosensitive composition according to claim 25, which is used as a near infrared cut filter or an infrared transmitting filter.

* * * * *